United States Patent [19]

Eggert et al.

[11] Patent Number: 5,629,831

[45] Date of Patent: May 13, 1997

[54] MODULAR CONTROL CIRCUIT WITH BUS CONDUCTOR

[75] Inventors: Gerhard Eggert; Walter Hanning, both of Detmold; Uwe Fiene, Steinheim; Michael Schnatwinkel, Herford; Rudolf Steinmeier, Detmold; Manfred Wilmes, Detmold; Eckhard Beins, Detmold; Matthiass Liesenjohann, Lage; Bernhard Schuster, Detmold; Andreas Wedler, Kalletal, all of Germany

[73] Assignee: Weidmueller Interface GmbH & Co, Detmold, Germany

[21] Appl. No.: 550,114

[22] Filed: Oct. 30, 1995

[30] Foreign Application Priority Data

Oct. 31, 1994 [DE] Germany ............ 44 38 806.3

[51] Int. Cl.[6] ......................................... H02B 1/26
[52] U.S. Cl. ............... 361/624; 361/637; 361/728; 361/823; 439/716
[58] Field of Search ......................... 361/600, 601, 361/624, 627, 637–640, 728, 822–823; 439/94, 721–724, 716

[56] References Cited

U.S. PATENT DOCUMENTS 4,956,747  9/1990  Beer et al. ......................... 361/728
5,037,310  8/1991  Marinello ......................... 439/61

FOREIGN PATENT DOCUMENTS 8332186  2/1984  Germany .
4121836  1/1993  Germany .
4303717  8/1994  Germany .

OTHER PUBLICATIONS

Intelligente Fieldklemmen Für Standardfeldbusse p. 83, Industrie Anzelger 1994.

Primary Examiner—Gregory D. Thompson
Attorney, Agent, or Firm—Laubscher & Laubscher

[57] ABSTRACT

A modular control system for connecting the electrical components of an automated system, such as switches, sensors, reactors and field units, with a master field bus system via an assembly of terminal blocks mounted on a grounded support rail, characterized in that the assembly includes a power supply terminal block, a ground terminal block, and at least one control signal terminal block for supplying control signals to control circuits carried by printed circuit boards contained within a removable electronics module. The various terminal block assemblies mounted on a given support rail are connected via internal bus bar means that is connected by a module with the master field bus.

36 Claims, 17 Drawing Sheets

MODULAR CONTROL CIRCUIT WITH BUS CONDUCTOR

FIELD OF THE INVENTION

A modular control system for automated buildings and the like includes a terminal block assembly mounted on a ground support rail for controlling the operation of the system electrical components by means of control circuits supported on printed circuit boards contained within an electronics module that is removably connected with the assembly. The terminal block assembly includes interchangeable ground, power supply and control signal terminal blocks that carry an internal bus bar which is connected with other assemblies mounted on the support rail.

BRIEF DESCRIPTION OF THE PRIOR ART

It has been proposed to control automated systems, such as machinery production runs, automated buildings and the like, by electronic control means which operate or are responsive to remotely located components, such as switches, sensors, reactors, field units, or the like. In the past, electrotechnical installation was so accomplished that each individual sensor switch, reactor, field unit or the like had to be connected directly, via a separate signal line, to the input/output cards of the control means that were installed in the switch cabinets. Subdivisions were installed here, in the form of terminal boxes partly in different places in the area of the machine or production system. The purpose of these terminal boxes is to bring together, in a central switch cabinet, the many switches, sensors, reactors or field units, distributed throughout the automated control system, for the purpose of transporting the signals. From the terminal box, the cables are laid via heavy plug connectors and a large number of control cables to the central switching cabinet of the control. For the purpose, again, the individual lines are distributed over the pertinent input/output cards of the control so that each cable, conducting a signal, on the whole had to be guided over a large number of connecting points. This type of wiring is both material-intensive and installation-intensive; it requires a great effort in terms of planning and documentation and is correspondingly vulnerable to error and defect.

It is also known to provide control systems that are arranged in the area of the terminal boxes of machinery system and that take care of a conversion of the incoming and outgoing signals of the individual sensors, switches, reactors and field units to a machine-wide or system-wide field bus system. For this purpose, one usually needs adaptation electronics means that is compact and takes up little space, that is extensively predetermined by the functional volume as well as the necessary structural members, that makes available a predetermined number of input/output connection elements, and that transfers them via the series-connected electronics to a field bus system. Usually, subassemblies must be installed, especially in the case of mixed or only slightly or highly different numbers of necessary connection possibilities for the existing sensors and reactors.

It is also known from German Patent No. DE 43 03 717 A1 to provide modular control systems that can be assembled from pluggable electronic modules and connection modules, where the connection module has supply conductor connections and signal conductor connections and is made up of individual terminal blocks. Here, connection pieces associated, on the one hand, with the supply block and on the other hand with the input/output block are made also in one piece and can be inserted individually in a common housing. Furthermore, the supply terminals and/or the input and output terminals are arranged in different connection levels. Different connection configurations of the input and output terminals are possible within a particular housing by means of an additional shunting plate. Furthermore, an electronics block is separably connected with the connection block, and the latter, preferably is stuck on top of or inside, upon or in the connection block, and can be connected electrically and mechanically by means of associated contacts between the electronics block and the connection block. One problem that arises in this presented solution referring to a modular control system is that a spatial separation between the supply block, on the one hand, and the input/output block, on the other hand, takes place and requires wiring only on both sides of the electronics module that is arranged spatially in between, as a result of which there is no sufficient accessibility of the wiring points in predetermined installation spaces, for example, in narrow terminal boxes or fully-occupied switching cabinets. It is also required to provide the supply terminals with insertion bridges in order to distribute the electrical potential, belonging to one block, among the individual discs of the supply block or the connection block. Moreover, it is impossible to operate switches, sensors, reactors or field units with the same signal form but different electrical supply values on one common connection block because precisely only one common, laterally distributed supply voltage can be tapped on each connection block. By embedding the individual connection discs in a housing that envelopes the entire block, a maintenance operation is possibly only after the extraction of the entire block and that calls for a considerable effort involved in taking the connection block apart.

The present invention was developed to avoid the above and other drawbacks of the prior art.

SUMMARY OF THE INVENTION

Accordingly, a primary object of the present invention is to provide a control system for coupling to an internal bus and master field bus system a plurality of different switches, sensors, reactors, field units or the like in such a manner as to ensure connection with a compact modular terminal block assembly affording extensive adaptability of the connection subassemblies to the problem to be solved in terms of treating and processing the signals of the user, by employing familiar installation methods with simultaneously simple maintenance and maintainability also of entire branches of the connection subassemblies, and that will permit clearly organized wiring sectors as well as a clear cable layout pattern.

According to a more specific object of the invention, a terminal block assembly is mounted on a support rail and includes power supply, ground and control signal terminal blocks, an electronics control module being removably mounted on the assembly and including control circuits operable by the control signals supplied to the control signal terminal block to operate various associated electrical components of the system.

One thing that is essential in terms of the invention as regards to the proposed modular control system is that there is proposed here a structured build-up of both an individual assembly from predetermined functional terminal blocks in a fixed spatial sequence and also that, within each assembly, the functionally different terminal blocks can be arranged in a predeterminable fashion. The sequence of the arrangement of the assemblies on the mounting rail, that is selected for the modular control system, and the arrangement of the terminal block within each assembly are oriented primarily in accordance with the needs of the user as regards an easily accessible wiring sector and a separation of the functions with respect to the tie-in to the sensors, switches, reactor and field units, or the like and the bus system.

Each terminal block assembly includes a first power supply terminal block is provided for the distribution of necessary electrical potentials to additional terminal blocks of the same assembly to which one can directly connect the likewise associated switches, sensors, reactors, field units, or the like. The proposed form of distribution and of connection of the associated components also makes it possible, by way of a special advantage, precisely also to implement the distribution of different electrical potentials within one particular assembly, as a result of which one can combine, especially, components that have identical but different electrical connection values within one connection block. In a second terminal block following the power supply terminal block in sequence, one preferably connects a control signal terminal block to which the signal conductor or conductors leading to or returning from the associated switches, sensors, reactors, field units, or the like. When there are different components, their supply voltage is also tapped here. The incoming or outgoing signal conductors are again conducted, by means of an internal bus bar integrated into the assembly, to a third terminal block which again is series-connected to the control signal terminal block for the separable arrangement of the electronics module. This electronics module is used in order to convert the electrically applied signals of the connection equipment that is made predominately in a parallel fashion to the internal serial bus conductor that, within a sector associated with the mounting rail, connects all assemblies of terminal blocks to each other and also connects them to the associated field bus. The electronics module here—all necessary functions for signal treatment and processing—establishes the coupling function between the plug connections that are linked to the signal connector connections and the bus system that adjoins it in terms space. Corresponding to this structured sequence of terminal blocks within an assembly, a predeterminal arrangement of terminal blocks within an assembly is obtained. Each assembly is preferably made up of a sequence that begins at one end with at lease one ground terminal block, preferably continued with at least one power supply terminal block as well as of at least one control signal supply/receive terminal block that is preferably arranged so that it will adjoin the power supply terminal block. Normally the assemblies are made up of a number of terminal blocks that are assembled in module fashion; here, at least one ground and one power supply terminal block will result in the necessary number of control signal terminal blocks. The ground and power supply blocks can be connected via the distribution means to the control signal terminal blocks and can make the necessary supply voltage and the ground conductor connection available to the associated components that are connected there. Finally, in another preferred embodiment, at least one end catch foot terminal block can be arranged as the termination of an assembly.

Particularly advantageous in the preferred sequence of the terminal blocks within an assembly is the fact that the user gets a clear sequence of functional elements that can be repeated at each assembly and the control signal terminal blocks, that are important for the operation of the components, permits good accessibility within a contiguous installation sector. The connection of also differing potentials of the supply voltages and currents is provided in a very flexible manner also without cables by means of prefabricated structural members to which, again, the cables of the load components can be connected directly. In that way, the procedure that is so familiar to the user as a result of the known technique of terminal blocks can be transferred to new possibilities of connection to a bus system as a result of which, above all, also due to the clearly organized wiring sectors, one can achieve a clearly observable cable guidance pattern. The modular structure of an assembly formed of selected terminal blocks further makes it possible, during installation, for testing purposes and also later on in connection with possibly necessary error searches and maintenance operations, to get directly at individual branches and sectors of the connection subassemblies and to separate them clearly from each other.

The structure of the individual terminal blocks, made up of spatially sequential functional blocks, makes it possible, for each of the functionally different terminal blocks, to provide or to equip in electrotechnical terms only those sectors on the housing side that are actually needed for the particular function. In that way, it is possible with just a few terminal block shapes or identical shapes of the terminal blocks, with differing assembly patterns, to implement very many different individual functions that are needed for the control system. Also very advantageous, above all likewise with reference to unproblematical maintenance and the exchange of defective components, is the fact that the electronics means for the treatment and processing of signals is centrally combined within the electronics module that is made separable and pluggable, as a result of which rapid exchange of such a unit is possible, or also the adaptation of the functions of each electronics module to the functional nature of each subassembly.

An advantageous embodiment of a ground terminal block has a mechanical and electrical connection to the grounded mounting rail and a plug-in connection to the electronics module; here, the ground terminal block does not need any connection for the internal bus conductor and that block is advantageously also made free and available on the housing side. The ground terminal block can in an advantageous manner be capable of being connected with the potential distribution to additional terminals blocks of the same assembly.

A power supply terminal block according to the invention, first of all, has an area, provided on the housing side, to receive the internal bus conductor and can be connected by means of the potential distribution bar means to additional connection discs of the same connection block and the electronics module. To the power supply terminal block one can thus connect the supply voltages both for the distribution to the components of the assembly and of the electronics module. Here again, it is possible in an advantageous embodiment in an electrically conducting manner to connect a power supply terminal with only one supply/signal terminal block within a particular assembly, or, on one particular power supply block, to provide only one connection exclusively to supply the electronics module.

A control signal terminal block for connection of the associated components of the system to the assembly consists of a sector in which one can also arrange cross-distributing distributor bars, a terminal block with at least one signal conductor terminal, the plug-in connections for the electronics module and the terminal block, provided on the housing side, to receive the internal bus conductor. Into the devices for receiving distributor bars one inserts catchably arranged, also cross-distributing connection elements that can be lined up to form distributor bars and upon which one can arrange the supply cables for the associated system components. For good clarity of the distribution of the potentials, these connection elements can be made color-coded in an advantageous manner. For the lock-on of the connection elements or distributor bars, the devices for receiving distributor bars have fastening means that cooperate with corresponding cooperating fastening means of the connection elements.

In another preferred embodiment, one can insert, into the devices for the reception of distributor bars, non-conductive elements that interrupt the electrical cross-connection of the stacked terminal blocks within the distributor bar at the particular plug-in point and which thus make it possible, also within a through-going distributor bar, to apply differing electrical potentials. Moreover, one can also provide more than just one such element or a distributor bar, equipped with such an element, can be combined with a bridge element.

For the mechanical fastening of each terminal block assembly to the mounting rail, each connection block preferably, on the two connection discs at the beginning and end of the passage of the mounting rail through the assembly, has terminal blocks that include catch feet for connection with the mounting rail, and for mechanical fastening on and/or electrical connection with this mounting rail. As a result, the terminal block assembly can be attached to the mounting rail in a mechanically safe fashion and at the same time one can make a connection to the mounting rail that is usually further connected as protective conductor. By means of the bilateral arrangement of terminal blocks that have catch feet, it is possible to line up additional terminal blocks that are arranged in between, also without direct mechanical contact, with the mounting rail, between these two connection discs.

A catch foot terminal block that can be fashioned in this way can, first of all, exclusively have one mechanical connection to mounting rail; such a catch foot terminal block can also additionally have the function of a ground terminal block. That ground block can then be provided for the exclusive connection of a separate ground conductor to the electronic module. It is also possible to make such a catch foot terminal block as a second supply block for exclusive connection of a digital output module and/or the electronics module; in that way, a separate voltage supply example, in case of trouble, the voltage supply of the other sensors, switches, reactors field units, or the like, is no longer guaranteed. The idea is, also in case of trouble, to be able to turn the digital output modules and the electronics module off in accordance with the safety guidelines.

When two ground terminal blocks are arranged within one assembly they can be provided in the stack at the start and end of the assembly. In a particularly advantageous embodiment, it is possible to combine identical system components, as needed, in connection blocks of identical control signal conductors or to form the assemblies from control signal blocks that are built-up in a functionally mixed fashion. By means of this line-up possibility of identical or different control signal terminal blocks within one particular assembly, one can, first of all, select combinations of functionally identical sensors for clearly laid-out installation; when needed, however, one can also form assemblies that are organized according to the local arrangement of the switches, sensors, reactors, field units, or the like.

In the embodiment mentioned above, it is particularly advantageous that the user can assemble an embodiment of a assembly that is precisely tailored to his needs and that, for instance, will fit in with connection conditions that occur in his system, to handle special operational requirements; said embodiment will have only the actually needed connection possibilities for functionally identical or differing switches, sensors, reactors, field units, or the like. In this way, one can get around the problems that frequently crop up in known modular control systems, that is to say, one could use only firmly predetermined module blocks with an unalterable number of connection possibilities that would not be consonant with the particular connection situation, e.g., of the system. Here, the important thing is to make sure that the individual connection points of such assemblies are not occupied, something that would necessitate additional space, so that there would also be procurement costs for connection elements that are really not needed. Furthermore, advantageous embodiments of such adapted assemblies could feature a building-block-type selection of needed connection elements with their particular transmission characteristic, so that assembly could be taken care of either by the manufacturer or by the customer. This means— especially also in case of conversions—for example, systems in which existing assemblies are altered and can be adapted to new connection conditions; this makes the modular control system, as based on the invention, particularly safe in terms of investment. The special manner of cross-distribution of needed electrical potentials can—in the control system according to the invention—also be ensured so that the needed structural space can be restricted to a minimum also when one provides greatly differing sensors, switches, reactors, field units, or the like, within one assembly.

In another, particularly advantageous embodiment, the internal bus conductor—which is arranged inside the area formed by the housing—is assembled by using bus bar pieces that can be connected in a separable and electrical/ mechanical fashion to the neighboring bus conductor pieces via movable and catchable separating slides. Such a segmented assembly of the bus conductor made up of bus bar pieces makes it possible, for example, during maintenance, electrically and mechanically to separate individual terminal block assemblies from the bus conductor by uncoupling out of the bus conductor and to unlock them then separately from the mounting rail. For this purpose, one uses the free available bus conductor sector, located in the area of adjacently arranged assembly, in each case, ground terminal blocks and the catch foot terminal blocks to form an operating space for receiving the mechanical unlocking of the connection block from the mounting rail.

The housings of the ground terminal block and the catch foot block that are not developed in the area of the bus conductor furthermore makes it possible to use this freely available area as activation zone for the separation slides for coupling to neighboring bus conductor pieces; here, first of all, the separation slides, on the side facing away from the mounting rail, are covered up, so long as the electronics module is fastened in its plugged-in location, and, besides, the bus conductor disc or the catch foot disc can be locked only after the electronics module has been removed. As a result, one can prevent an assembly from being unlocked inadvertently, that is, an assembly that is still electrically connected to the bus system. One of the bus connectors, is provided with an assembly for coupling the bus conductor associated with the mounting rail to an associated field bus system; on the end of the internal bus conductor, that faces away from the field-bus-side end, there is provided a plug-gable termination element with termination resistances of the internal bus conductor that can preferably be made as a plug-in shoe with a plate arranged on the internal bus conductor plate, said former plate again carrying the terminating resistances between strip bus conductors.

To couple the signal conductors to the internal bus conductor, each electronics module has at least one, each, pluggable and separable plug connection, so it can be connected, on the one hand, to the electrical connection elements associated with the signal conductors, and, on the one hand, to the internal bus conductor, whereby these plug-in connections are connected to each other via functional printed circuit boards on which the signal treatment and processing take place.

In an advantageous embodiment, there is associated with each assembly at least one electronics module; depending on the particular case of use, one can also associate more than just one assembly to one electronics module or of several electronics modules power connection block. When passive initiators/field units are connected—whose supply connections simultaneously provide an analyzable signal—then one can get along without the devices for the reception of distributor bars of the associated supply/signal conductor disc; in that case, at least two signal conductor connections are provided. In case of the connection of active switches, sensors or units, one must always provide at least one device for the reception of distributor bars and at lease one, each, signal conductor connection, in order to be able to conduct the signals, coming back on the signal conductor, to the electronics module.

The electronics module has a housing that envelopes at least one terminal block and that stabilizes the terminal blocks that are lined up next to each other in at least one assembly and that is color-codable. In that way, the housing of the electronics module, in addition to the catch foot terminal blocks, also has the function of the mechanical coupling of mutually aligned terminal blocks, as a result of which the color-coding prevents a false arrangement of the electronics module. If an electronics module is associated with more than one assembly, than its housing can also envelope more than just the terminal blocks of the assembly. Preferably on each terminal block, there are provided molded elements for the lock-on of the electronics module and those elements are preferably made as elastic catch hooks and, as the electronics module is stuck on, they penetrate corresponding recesses of the housing of the electronics module in which connection, preferably, only a part of these recesses are provided with catch elements that cooperate with the catch hooks. In that way, the activation forces are restricted while the electronics module is plugged on and taken off. Additionally, there is provided, on each terminal block, an elastic catch hook but only one engages a corresponding recess on the reverse side of the electronics module. In that way one can make sure that the electronics module can be released only by means of a tool. Likewise, on each assembly, upon at least one guide surface for the electronics module, one can provide a number of molded elements by means of which the electronics module is guided during the insertion operation and that are preferably made in the form of T-grooves. With the molded elements that correspond to the T-grooves or parts of T-grooves, made in each terminal block, on the housing of the electronics module, whereby preferably only two such molded elements are actually provided with the T-grooves of the terminal blocks and are made to engage them. In that way, likewise, one can insert the electronics module in a guided manner without any jamming due to a large number of joint points.

A preferred form of attaching the housing of the electronics module is to provide—on the edge attached and circulating along the open side of the housing—a height step so that the housing can be mounted only in one orientation, into the plug-in point of the electronics module.

It is particularly advantageous furthermore that, during the removal of an electronics module from one or more of the associated assemblies by the continually connected bus conductor, the remaining assemblies arranged on the mounting rail, remain fully functional.

In an advantageous embodiment, for the purpose of connecting the shields of the associated connection cables, one can mount an adjustable-length bus bar upon the ground terminal block and another catch foot block, an electrical connection to the mounting rail is provided and upon which the particular extended shielding of the incoming connection cable can be clamped as necessary on the bus bar, by means of likewise catchable clamping pieces.

All conductors on the supply/signal side are connected on the side of the terminal block remote from the mounting rail; after completion of wiring, the electronics module can be removed also without releasing the wiring in the form of a so-called standing wiring. To mark the individual connections to the assembly, in addition to the application of labels directly on the connection discs, there may also be provided, preferably as pluggable labels, one or several large marking surfaces by means of likewise of pluggable labeling lids and/or swingable main plate carriers above the wiring level. The good accessibility to the wiring level in the area of the connection of the supply conductors connections lie parallel to the plane of the mounting rail on the same height level and therefore are equally well accessible.

BRIEF DESCRIPTION OF THE DRAWINGS

Other objects and advantages of the invention will become apparent from a study of the following specification, when viewed in the light of the accompanying drawing, in which.

DETAILED DESCRIPTION

Figure 1:
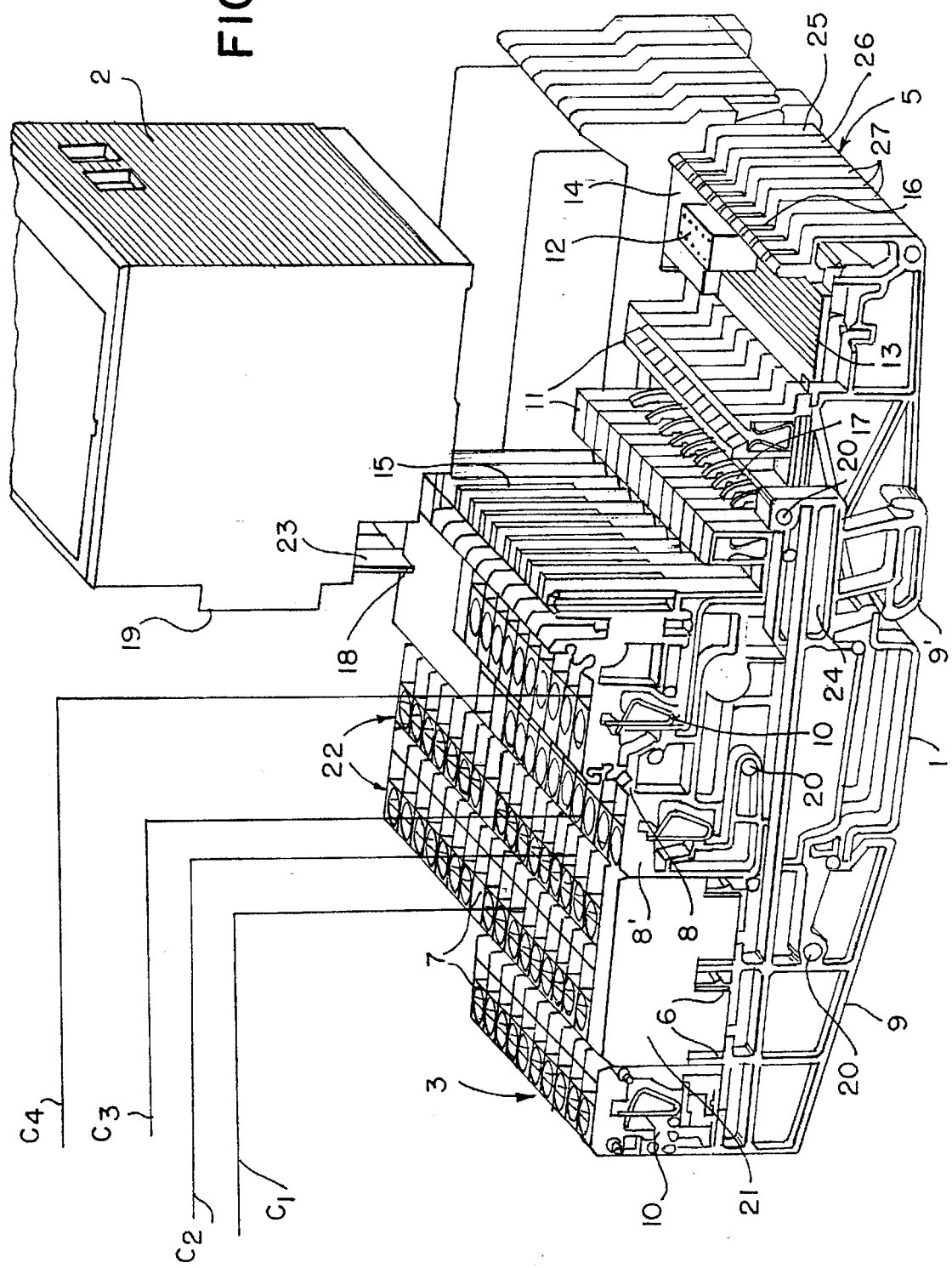
FIG. 1 is a partially disassembled perspective view of the terminal block assembly and modular control system of the present invention.

Referring first more particularly to FIG. 1, to FIG. 1, the control system includes a terminal block assembly that is mounted on a grounded support rail 1 and to which an electronics module 2 is removably connected by plug connections 11. The terminal block assembly comprises a plurality of laterally-stacked generally-rectangular terminal blocks 24-27 that are bolted together by laterally extending connecting rods 20, thereby to form a rigid unit with the axis of the stack extending parallel with the support rail. The terminal block assembly includes a ground terminal block 25, a power supply block 26, a plurality of control signal terminal blocks 27, and an end terminal block 24. The respective terminal blocks are laterally connected by distributor bar means 7, whereby power may be supplied to the various components controlled by the system and/or to the control circuits carried within electronics module 2. The terminal blocks 27 include resilient contact means 10 for plug-in connection of the various conductors, as will be described below. The details of the distributor bar means 7 are disclosed with greater particularity in the copending application Ser. No. 08/550,115 filed Oct. 30, 1995 in the names of Walter Hanning, et al. Of course, other connection means (for example, screw connection means and/or plug connection means) could be provided for connecting the cables and conductors to the terminal blocks.

Figure 6:
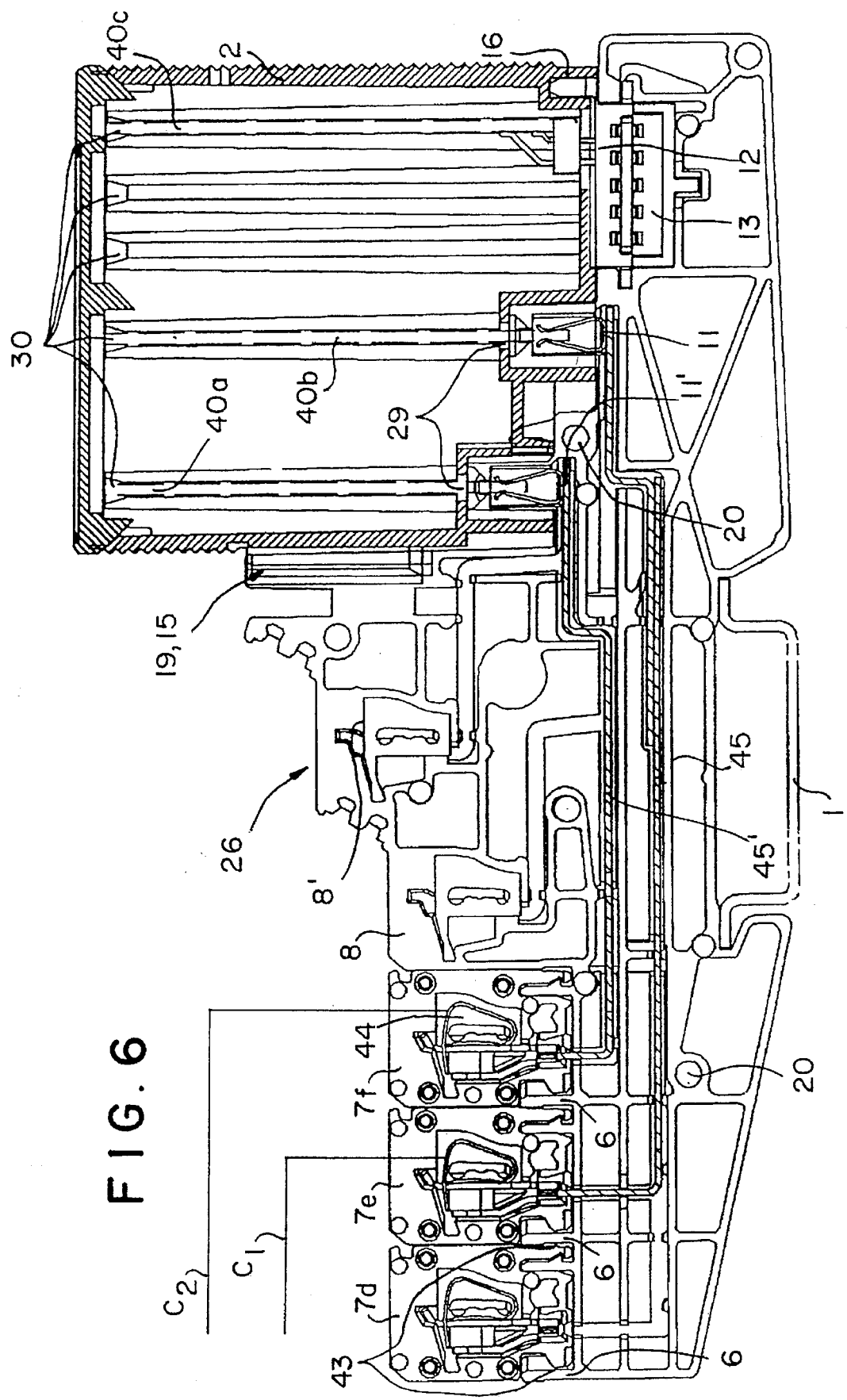
Figure 7:
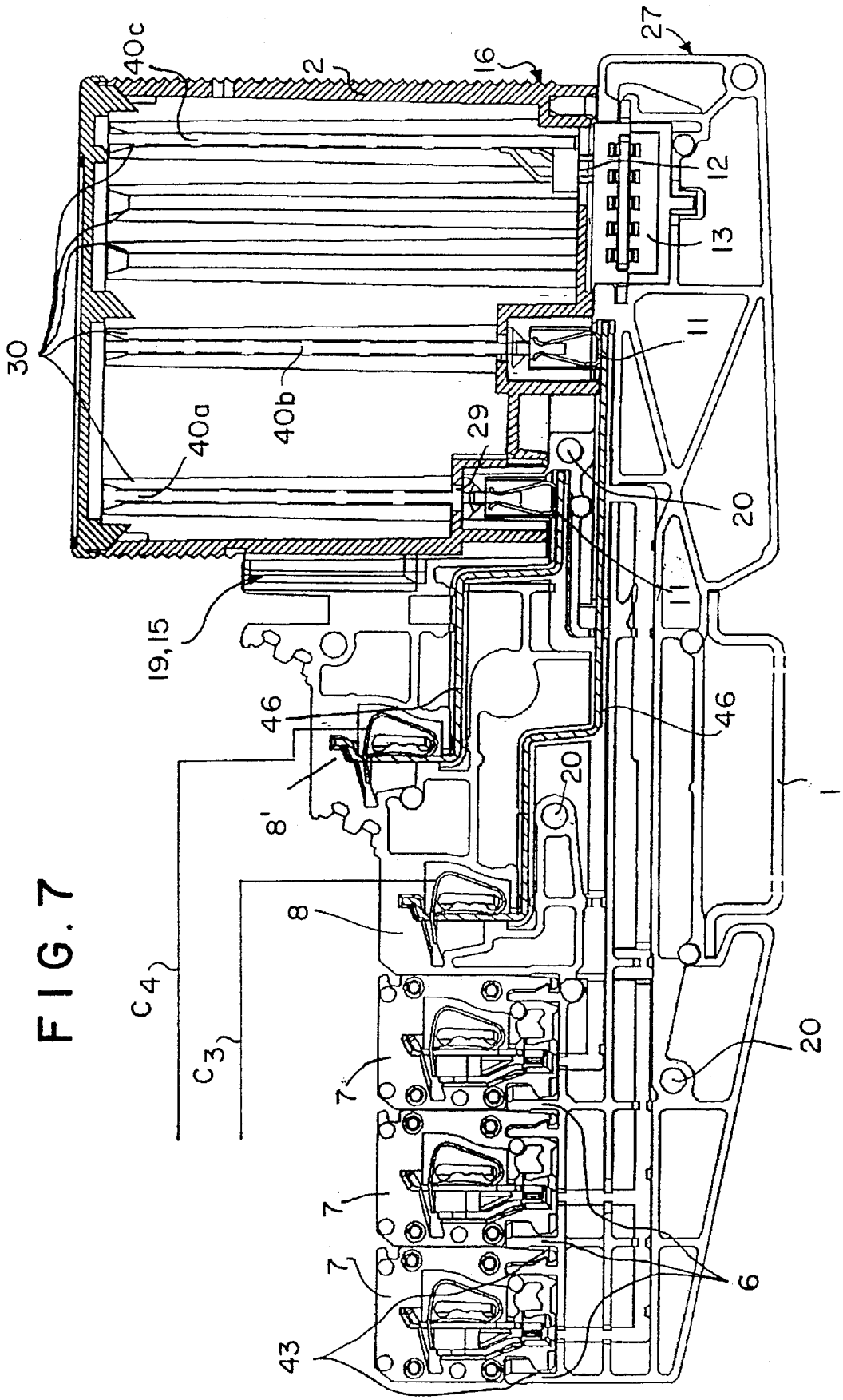

The distributor bar means 7 are removably connected with the terminal blocks of the assembly by resilient fastener means 6, as shown in greater detail in FIGS. 6 and 7. In FIG. 6, the power supply conductors $C_1$ and $C_2$ are connected with plug-in terminals 11 and 11' via bus bars 45 and 45', respectively. Referring to FIG. 7, adjacent the distributor bar means 7 are a pair of control signal input and/or output terminals 8 for providing control signals to or from printed circuit boards 40 contained in the electronics module 2 as will be described in greater detail below. The control signal input terminals 8 and 8' are vertically stepped, thereby to afford improved access to the terminals. The terminals of distributors bars 7d, 7e and 7f of FIG. 6 and the input terminals 8 and 8' of FIG. 7 may be provided with lateral conducting projections for connection with the associated terminals of the adjacent signal terminal block, as will be described below.

Figure 2:
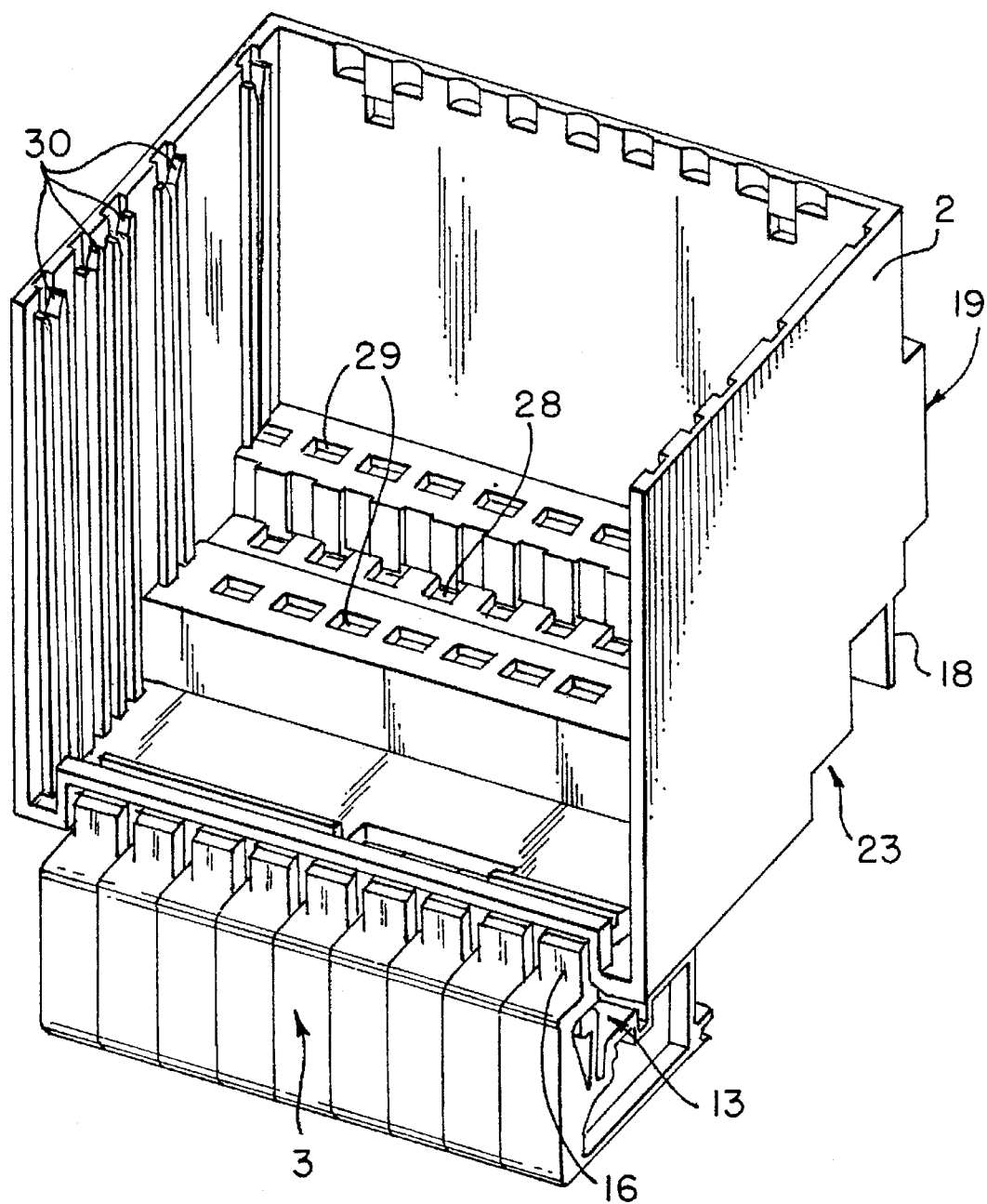
FIG. 2 is a perspective view of the housing of the electronics module of FIG. 1, with certain parts removed.
Figure 15B:
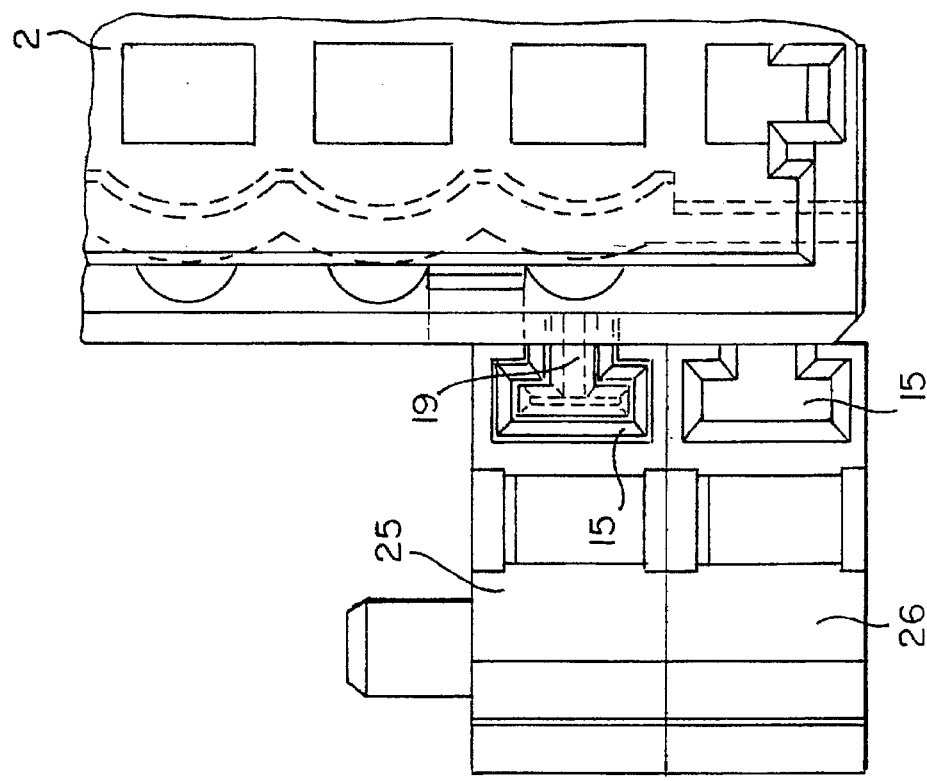
FIGS. 15a and 15b are detailed plan views respectively, of the module guide means of FIG. 1.
Figure 15A:
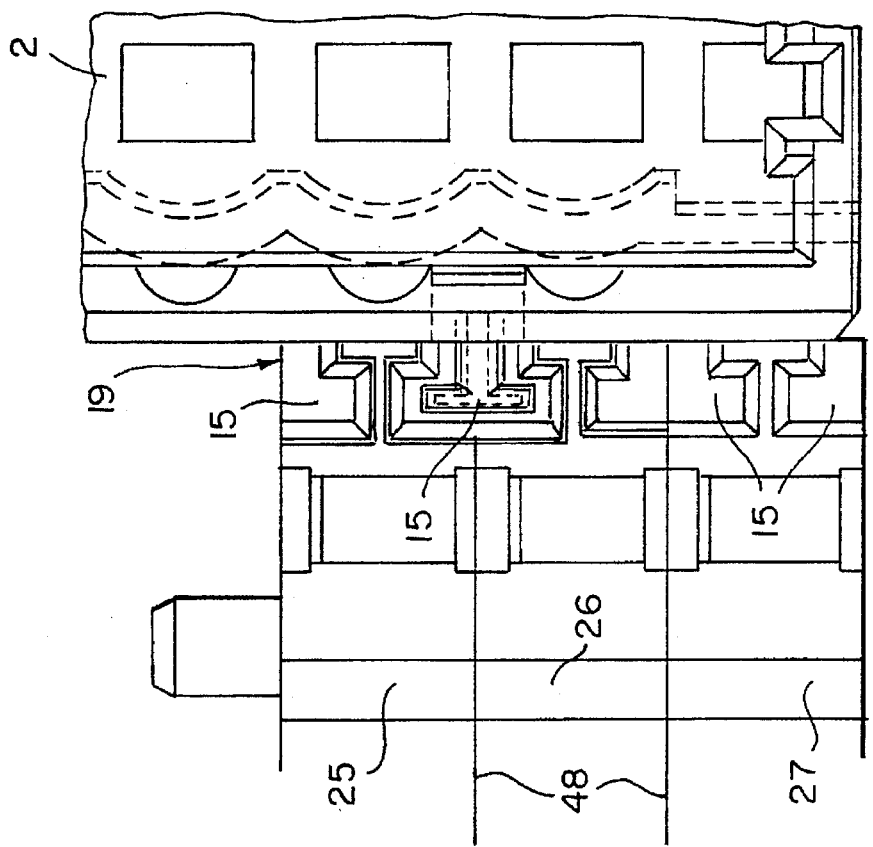

Plugged into the assembly adjacent the signal conducting terminals 8 is the electronics module 2 having guide and fastening elements which correspond with similar elements on the terminal block assembly. Referring to FIG. 2, the housing of the electronics module includes a plurality of orthogonally arranged vertical walls including guide means and fastening means for connecting the housing to the terminal block assembly 3. First, guide surfaces 15 are provided on the terminal blocks including a vertical groove of T-shaped cross-sectional configuration for receiving corresponding T-shaped projections 19 on the housing of the electronics module, as best shown in FIGS. 15a and 15b. Thus, the T-shaped projections 19 on the housing are inserted vertically within the T-shaped guide grooves, and during the insertion process, a plurality of guide tongues 18 on the housing of the electronics module extend behind the plug connections 11 adjacent the guide means 15.

Similarly, the terminal blocks are provided with resilient clip means 16 spaced from the guide means 15 for cooperating with the adjacent side of the housing of the electronics module. The guide clips 16 are associated with a number of catch hooks 17 for fastening engagement with the housing of the electronics module 2 and cooperate with recesses 28 arranged inside the housing 2. By means of these catch hooks 17, the electronics module housing is locked onto the assembly in the mounted position and is restrained against movement in the vertical direction.

Within the housing of the electronics module, there is provided a plug connector 12 for engagement with corresponding plug terminals on the internal bus bar means 13, as best shown in FIG. 6. The electronics module 2 is thus connected by means of simple vertical mounting both to the assembly 3 and the supply and control voltages applied upon the terminal side of the assembly, as well as the internal bus conductor 13 that connects the assemblies mounting on a mounting rail to the field bus connection module 4. The plug terminals 11 which link the electronics module 2 to the signal conductors connected with the terminals 8 also retain the functions for supplying the electronics module with the necessary electrical potentials as well as the connection with ground via ground terminal block 25. Thus, the various terminal blocks 24-26 are electrically connected with other components of the assembly 3. Similarly, the plug-in connections 11 of the control signal terminal blocks 27 are electrically connected with the signal terminal connections 8 so that the control signals applied via signal cables $C_3$ and $C_4$ will be applied to the printed circuit boards 40 (FIG. 5) arranged within the electronics module 2 via plug-in connections 11. A second plug-in connector 12 serves to connect the printed circuit boards within electronics module 2 to the internal bus bar conductors 13. The control signals from the internal bus bar conductor 13 are then passed on to the field bus connection module 4 via connector 14, or to other internal bus bar means 13 of the other assemblies mounted on the support rail 1.

The field bus assembly 4 (FIG. 3) is mounted on the assembly 3a and, together with the connection electronics for the main field bus, only contains terminal blocks 2 for supplying electrical power to the field bus connection module 4 as well as for the distribution of electrical potentials to the series connected assemblies 3a, 3b, and 3c. Within field bus connection module 4, the signals of the internal bus bar means 13 are so processed that, for example, the assemblies 3 arranged on several mounting rails can be connected with each other, or that signals are passed onto a master analyzing station.

As indicated previously, the assembly 3 of the end terminal block 24, ground terminal block 25, power supply terminal block 26 and control signal terminal blocks 27 are connected together by suitable bolt means 20 that extend through corresponding aligned openings contained in the terminal blocks. The terminal blocks 24 and 25 appearing at opposite ends of the assembly are provided with mounting or catch feet portions 9 which engage the mounting rail to maintain the assembly thereon. The engagement is accomplished in a known manner by introducing one of the catch means 9 beneath one flange of the support rail and pressing down on the other end of the assembly to cause the catch foot 9' to snap resiliently under the associated hinge of the support rail 1. To disassemble an assembly, the electronics module 2 and the internal bus conductor means 13 are removed from the assembly, whereupon a tool is introduced in the space between the assembly and the bottom of the support rail whereupon leverage is applied to the tool to raise the assembly upwardly from the support rail. Owing to the connection of the terminal blocks together by the connecting means 20, all of the terminal blocks of the assembly are lifted as a unit from the support rail. On one side of the assembly there is provided a bridge element 21 for bridging the terminals of the associated terminal block, as disclosed in greater detail in the copending Hanning et al application Ser. No. 08/550,115. Thus, the bridge element electrically spans the terminals of the associated distribution elements, whereupon one can cross-distribute various potentials within the distribution bar means along as there is no spacer element (FIG. 18) arranged between the adjacent distribution portions 7.

Figure 5:
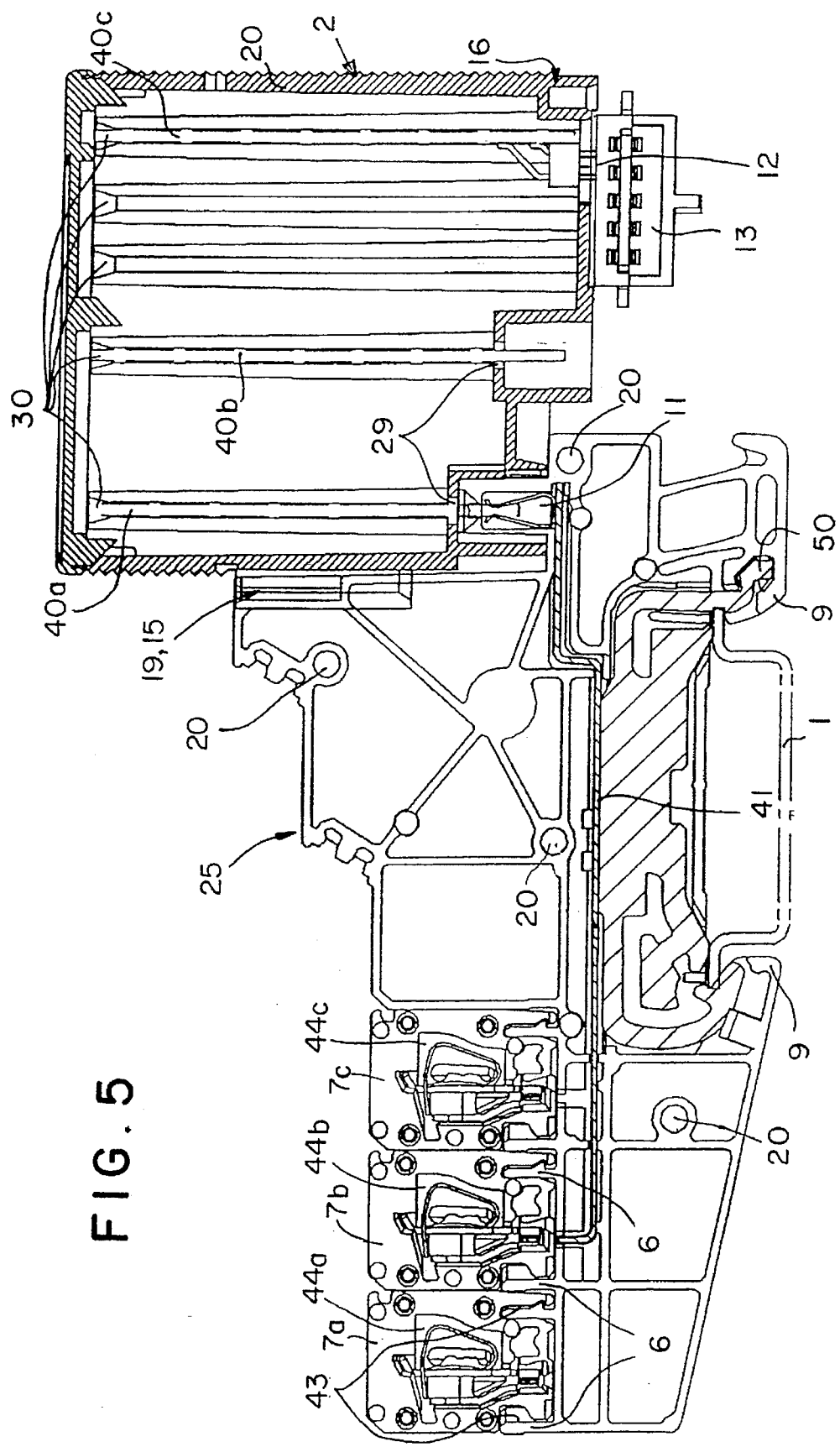
FIGS. 5–8 are sectional views of the ground, power supply, control signal supply and end support terminal blocks, respectively, of the assembly of FIG. 1.

Referring again to FIG. 2, the printed circuit boards of FIG. 5 have been removed, and it will be seen that the housing of the electronics module is arranged above the internal bus bar conductor means 13 that extend above the terminal blocks of the assembly 3. On the remote side of the housing, the T-shaped guide projections 19 are provided together with the guide tongues 18 that rest against the assembly 3. The housing 2 has a stepped bottom portion 23, thereby to assure that the housing can be mounted on an assembly 3 only on one given orientation, and to prevent any misconnection of the different electrical contacts when the module is mounted on the assembly.

Spaced from the control signal terminal are the guide clips 16 that engage a corresponding groove-shaped depression in the housing 2 and which also serve to guide this housing as it is mounted on the assembly. On the stepped underside 23 of the module 2 there are provided three rows of recesses 28 and 29 so arranged that they will fit in the plug-in terminals 11, 11' for the purpose of lining up the terminal blocks 24–27 relative to the interior of the housing of electronics module 2. The printed circuit boards 40 are guided in guide rails 30 on the two sides of the housing so that they are accurately plugged into the plug-in terminals 11 that protrude upwardly from the terminal blocks. Between the two rows of recesses 29 for the plug-in terminals 11, 11', there is arranged a row of recesses 28 which receive catch hooks 17 (FIG. 1) from underneath the housing. In some of the recesses 28 there are provided molded elements that correspond to catch hook 17, thereby to fasten the housing units illustrated position upon engagement of the molded elements with catch hook 17.

Figure 3:
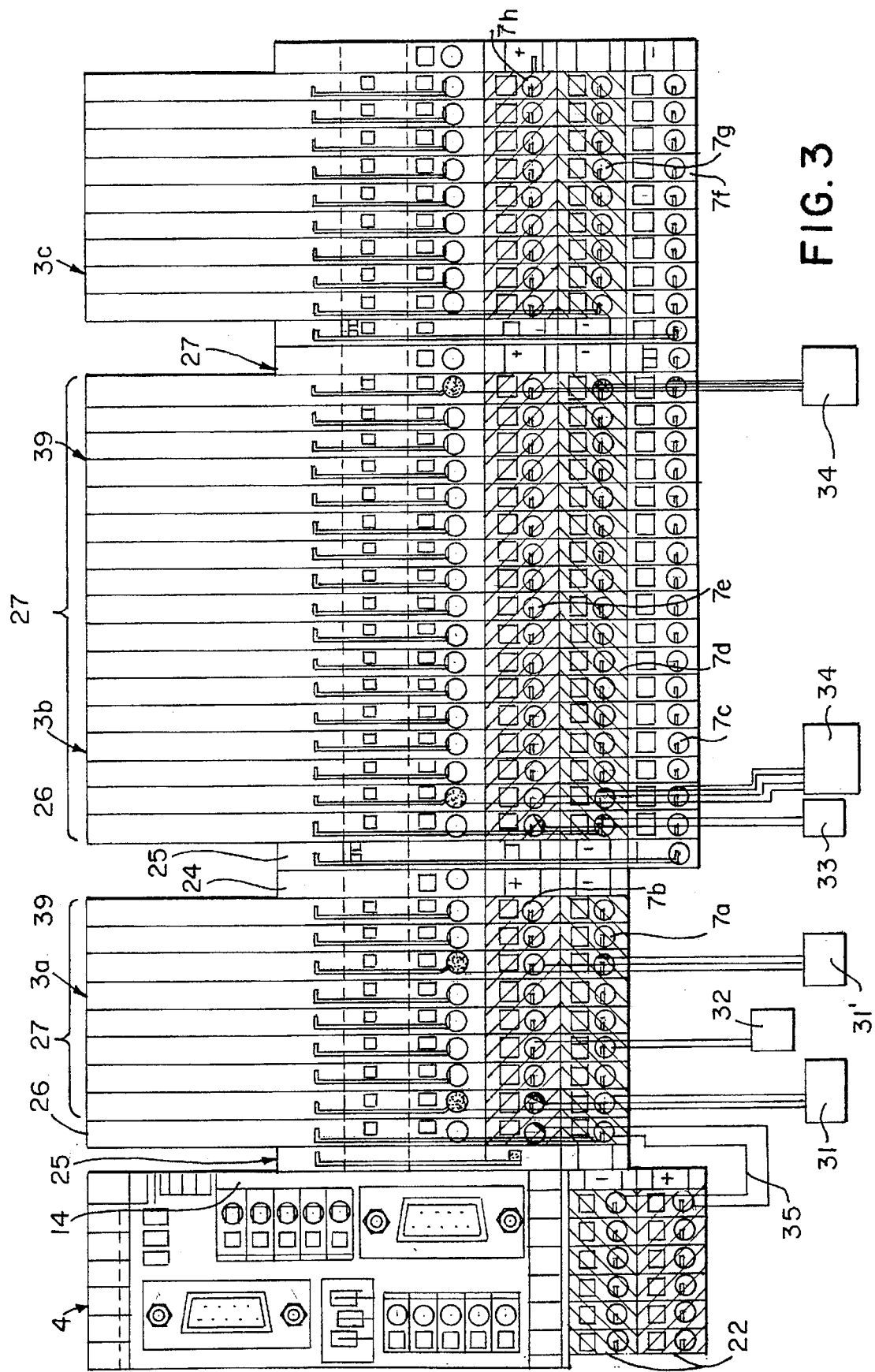
FIG. 3 is an electrical schematic diagram of a first digital embodiment of a control system according to the present invention including three terminal block assemblies.
Figure 4:
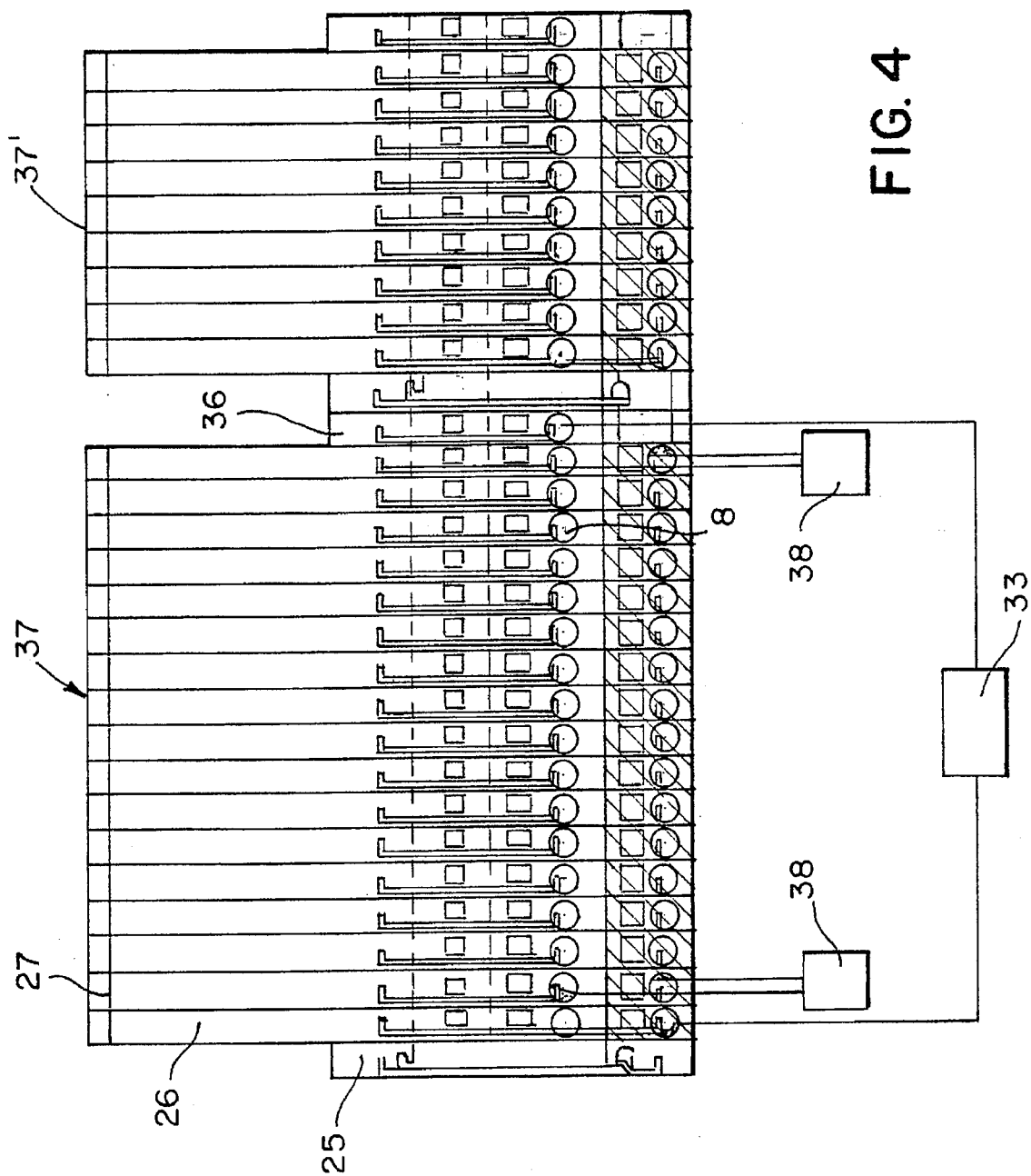
FIG. 4 is an electrical schematic diagram of a second distal embodiment of the invention including two terminal block assemblies.

Referring now to FIGS. 3 and 4, the circuitry is illustrated for connecting the main field bus assembly 4 with the terminal block assemblies 3a, 3b, 3c, or the subassemblies 37 and 37' (FIG. 4) on the mounting rails 1. The field bus includes a connector terminal block 14, and power supply connection elements 22 for supplying electrical power to the field bus module 4 and for the distribution of electrical potentials to series connected assemblies 3a, 3b and 3c. The main field bus connection module 4 also is fastened to the mounting rail 1, and adjacent the connection module is provided the first assembly 3a consisting of eleven terminal blocks, namely, and end terminal block 24, a ground terminal block 25, a supply terminal block 26 and a plurality of control signal blocks 27 arranged between the end and ground terminal blocks. As indicated previously, the end and ground blocks 24 and 25 are provided with catch or mounting feet means 9, 9' for mounting the assembly on the support bar. The connection between the two assemblies 3a and 3b as well as remaining assemblies 3c is effected by the internal bus bar conductor means 13; thus, only the area of one separation component 14 is given and with whose help the internal bus bar means 13 of the first assembly 3a can be separably connected with the conductor 13 of the bus connection module 4.

As shown FIG. 3, the first assembly 3a includes a plurality of terminal blocks having two distributor bar elements 7, while the remaining assemblies 3b and 3c includes terminal blocks each having three distributor bars, thereby permitting different voltages to be supplied to the different terminal contacts of the terminal blocks. The power is supplied to the first assembly 3a via cable means 35 for the internal voltage supply from the distribution bars 22 on the field bus connection module 4 to the power supply terminal block 26 of the first assembly 3a. From here, the electrical power is cross-distributed by means of connecting elements 7a and 7b through the control signal terminal blocks 27, a certain potential being available with one plus pole and one minus pole. Cross distribution of the voltage terminates before reaching the end catch foot block 24 at which place a second voltage source 33 supplies power to the power supply terminal block 26' of the second assembly 3b. In this second assembly 3b, the electrical potential of the ground conductor tapped off of mounting rail 1 on ground terminal block 25 is conducted to a third distributor bar 7c, whereupon in addition to the plus and minus potentials, the ground conductor potential for connection of the active sensors 34 and 34' is provided in addition to the plus and minus potentials. Thus, in assembly 3a, passive sensor 32 may only have two leads, while the other sensors 31 and 31' have three leads.

The assemblies 3a and 3b are used in connection with passive sensors 31 and 32 that supply digital signals to the electronics modules associated with the assemblies. The sensors 31 and 31' supply digital signals to the control signal terminal block 27 of the assembly 23a by means of three conductors one of which is to ground, and the passive sensor 32 is connected via two conductors. The active sensors 34 and 34' are connected to the terminal blocks 27' of assembly 3b via four conductors. The sensors 31 are active sensors that are to be operated with a direct voltage supply in that, via a signal line, deliver a feedback report to the assembly 3a and the associated control module. On the other hand, sensor 32 is a passive sensor whose signal consists of a change of the supply voltage. Thus, a connection is made with the power supply by terminal block 26 and the other connection is made to the control signal terminal block 27. Within the first assembly 3a, by means of connecting bars that will be explained in greater detail below, these electric potentials that are applied to the signal conductor connections are fed to the plug connections 11 for connection to the electronics module 2, whereupon the signals are then treated and processed and are switched to the internal bus bar 13. On the other hand, the sensors 34 are active sensors that are to be operated with a direct voltage supply. In this case a ground conductor is added for example and a signal line is run back from the sensor to the signal conductor terminal. The second assembly 3b again is provided with its own voltage source 33 having a direct-current voltage potential.

Referring now to FIG. 4, a pair of subassemblies 37 and 37' of the terminal blocks are provided on the same mounting rail one. The subassembly 37 includes a ground terminal block 25, a power supply terminal block 26, a number of control signal terminal blocks 27, and a catch foot end block or separating plug 36. The subassembly 37 includes a distributor box made up of a plurality of connection elements that apply a negative potential which is switched in from an external voltage supply 33 first upon the distributor bar means and secondly as a counter pull for supplying the output subassembly via the catch foot end terminal lock.

Connected to a pair of the signal blocks are reactors 38 and 38' that tap the negative potential of the supply block 26 and have a signal line connected with the associated control signal terminal 8. Catch foot end terminal block 24 of subassembly 37 has a special feature in that the positive potential which is applied to the signal conductor connections 8 via the output electronics can be separated in an emergency via an external switch (not shown), without the outputs having to be replaced.

Referring now to FIGS. 5–11, the detailed structures of various terminal blocks have been illustrated. As shown in FIG. 5, the ground terminal block 25 includes spaced resilient catch means 6 for connecting a plurality of distributor bar means 7a, 7b, and 7c. The distributor bar 7b is connected with the terminal 11 via a bus bar 41 that is connected with the grounded support rail 1 via a conductive member 50 that is seated upon, and is in electrical contact with, the support rail 1. Thus, the terminal 11 of the printed circuit board 40a is connected with ground via the bus bar 41, ground member 50 and support rail 1, and the printed circuit board 40b is connected with the internal bus bar 13 via plug connector 12. The openings 20 for receiving the assembly fastening rods are shown. In the area of power distribution, the three distributor bar members 7a, 7b and 7c are maintained in place by fastening elements 43, and each of the distributor blocks includes a resilient contact 44a, 44b and 44c. No signal conductor terminals 8 are provided in this ground terminal block. The guide means 15 carried by the ground terminal block 25 contains T-shaped grooves for receiving the T-shaped projections 19 on the housing 20 of the electronics module 2. The printed circuit boards are vertically mounted between guide rails 30 having plug connections that engage the plug-in terminals 11, 11'. On the ground terminal block 25, there is provided only one single plug-in terminals 11, 11'. The openings 29 contained in the bottom wall of the electronics module housing 20 receive the terminals on the printed circuit boards that engage the plug-in terminals 11. The mounting feet 9 and 9' on the ground terminal block serve to connect the same to the flanges of the mounting rail, as described above.

Referring now to FIG. 6, the power supply terminal block 26 is not provided with catch feet and merely sits upon the support rail 1. The power supply block has a plurality of pairs of spaced resilient fasteners 6 for engaging corresponding fastening elements 43 on the distributor bars 7d, 7e and 7f. The power supply conductor $C_1$ is connected with printed circuit board 40b via resilient terminal 44e, internal bus 45, and plug-in terminal 11' and power supply conductor $C_2$ is connected with printed circuit board 40a via resilient terminal 44f, internal bus bar 45', and terminal 11. Printed circuit board 40c is connected with the internal bus bar means 13 via plug-in connector 12. No signal conductor terminal is provided at the housings 8 or 8'.

Referring to FIG. 7, the control signal supplied by conductor $C_3$ is connected with printed circuit board 40b via resilient contact of terminal 8, internal bus bar 46, and plug-in terminal 11, and control signal on conductor $C_4$ is supplied to printed circuit board 40a via bus bar 46' and terminal 11'. The control signals are supplied to or from the control circuits on the printed circuit boards, the conductors $C_3$ and $C_4$ being connected, for example, to sensors, switches, reactors, field units or the like. The illustrated signal terminal block makes it possible to connect a sensor and a reactor with the signal inputs 8 and 8', respectively. For power supply purposes, for example, a positive potential can be tapped off of the distributor bar 7 for the sensor or switch, and a minus or plus potential could be tapped off distributor bar 7 for the reactor.

Figure 8:
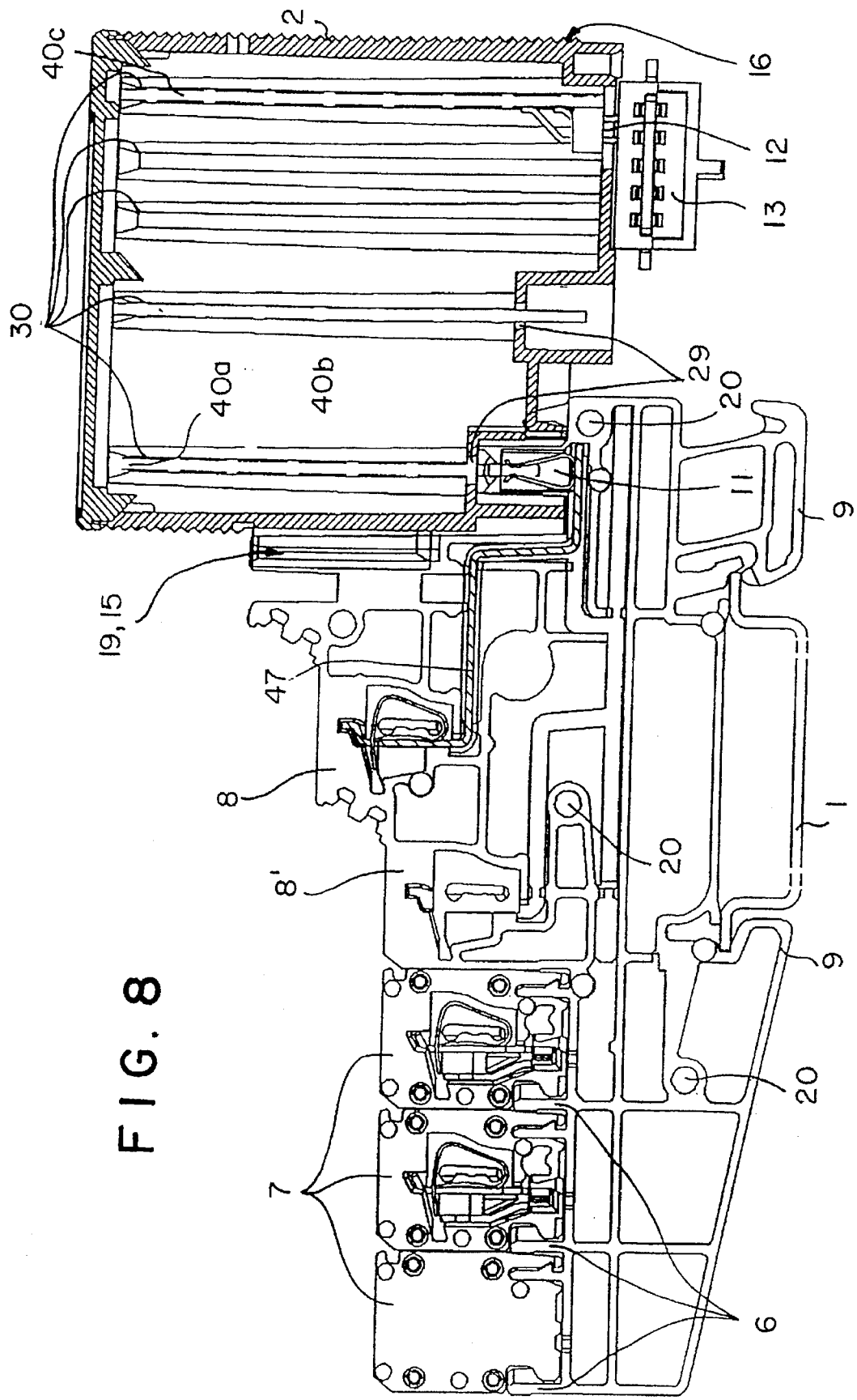

Referring now to FIG. 8, the end support terminal block 24 has catch feet portions 9 and 9' that connect the end support terminal block to the ground support rail 1. As distinguished from the ground terminal block of FIG. 5, the end support terminal block has no . conductor in engagement with the grounded support rail 1. It will be seen that one of the signal bars 8 is provided with a terminal that is connected with the plug-in terminal of printed circuit board 40a via internal bus bar 47 and plug-in terminal 11. In this manner, for example, the appropriate potential can be provided separately to electronics module 2. The other signal conductor connection 8' is not equipped with any electrical contacting bar.

Figure 9:
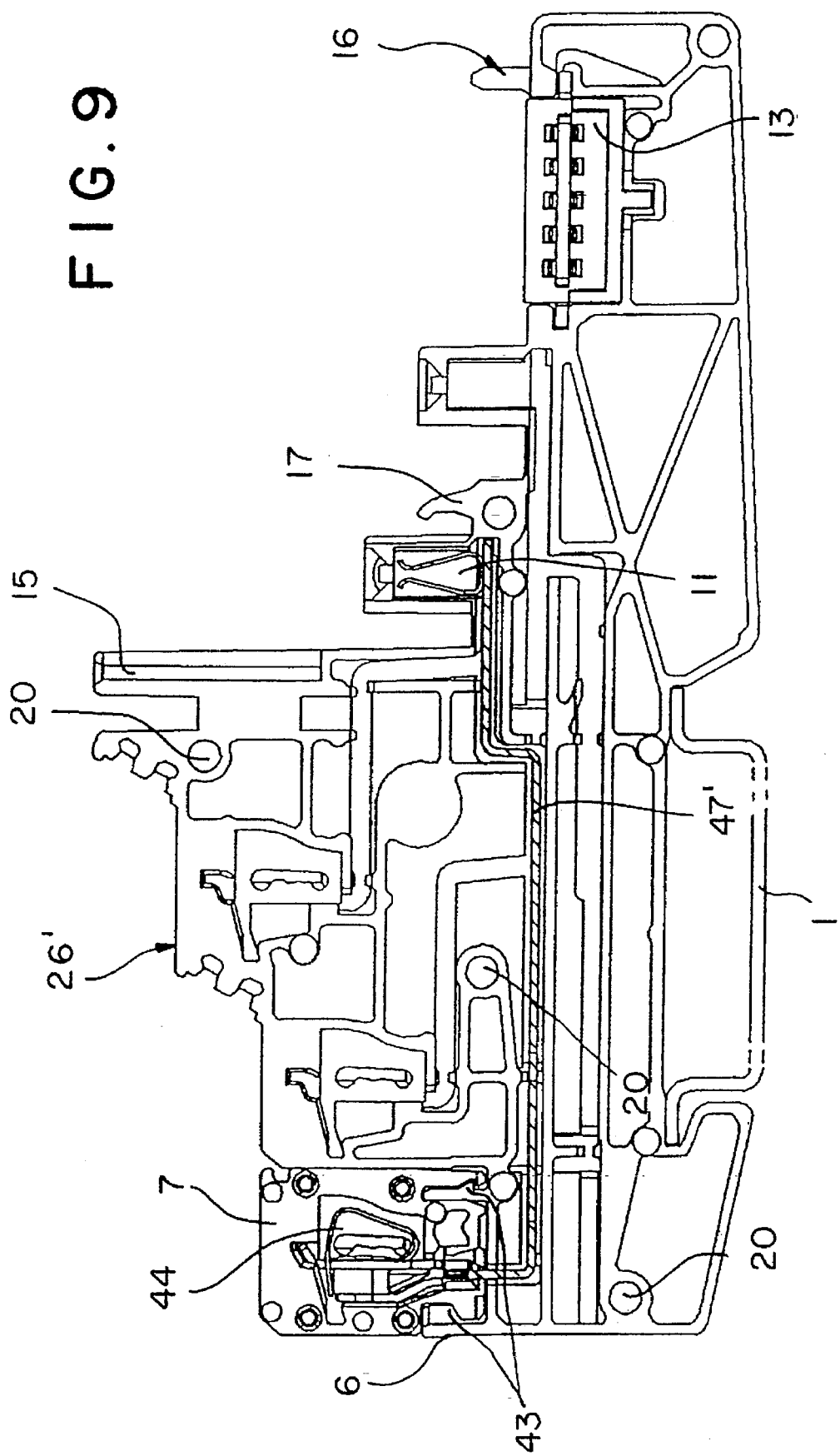
FIG. 9 is a sectional view of another embodiment of the power supply terminal block of FIG. 6.

Referring now to FIG. 9, the illustrated power supply terminal block 26' is provided with only a single distribution element 7 and a single bus bar 47', thereby to connect the distribution bar 7 with the plug-in terminal 11 via bus bar 47', thereby to supply power to the associated printed circuit board. Thus, only one conductor of the supply is connected directly to the electronics module 2.

Figure 10:
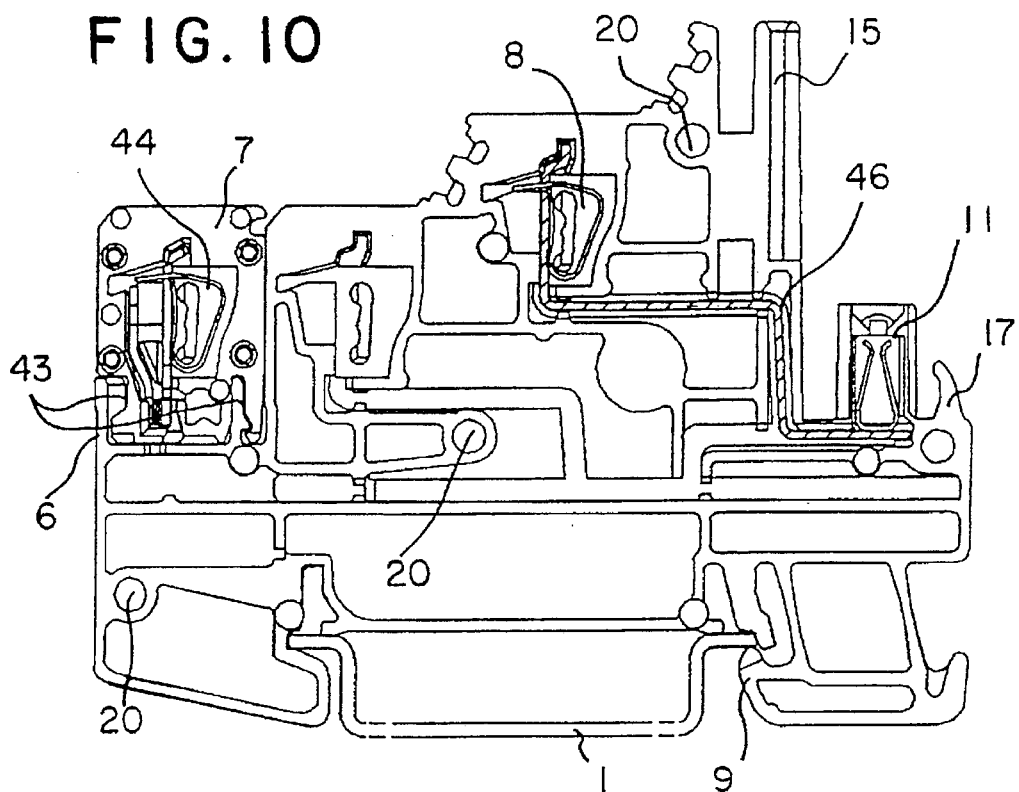
FIGS. 10 and 11 are modifications of the end support and ground terminal blocks, respectively.

Referring now to FIG. 10, the end support terminal block 24' includes the catch feet 9 and 9' for connection with the support rail 1, and there is provided a single distributor bar 7 that is connected with the terminal block via the pair of resilient fastening members 6. A single signal terminal 8 is provided for connection with the plug-end terminal 11 via internal bus bar means 46, thereby to supply a control signal to the associated printed circuit board. Thus, it is possible to effect separate input of a given electrical potential to the electronics module 2, as is necessary for operational safety of reactors connected to digital output units.

Figure 11:
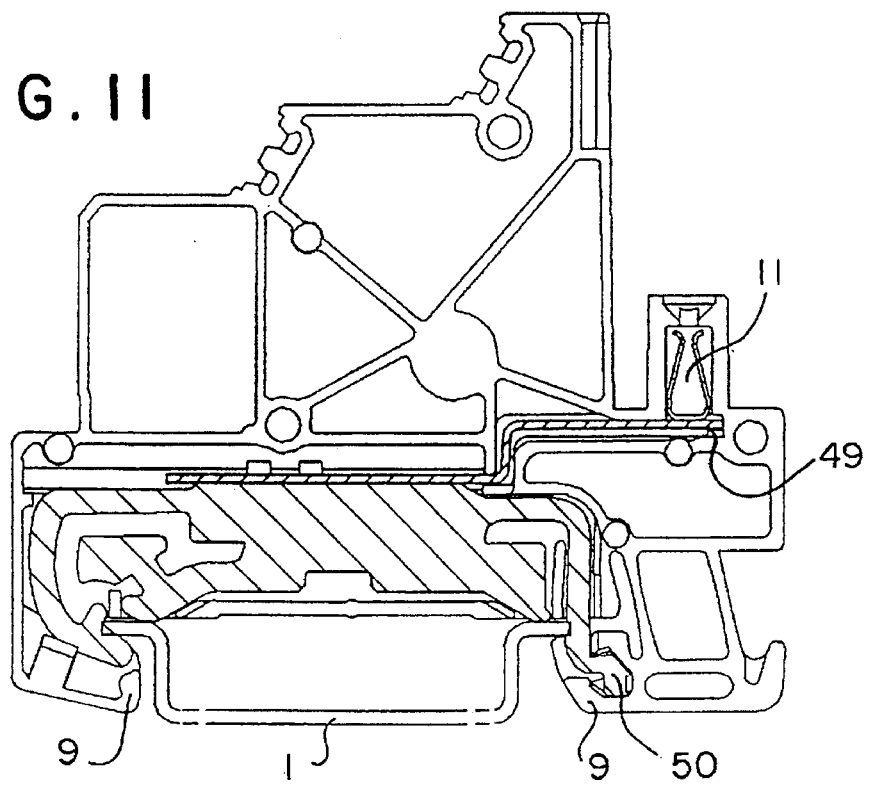

Referring to FIG. 11, the ground terminal block 25' does not have any distributor bar nor any internal bus bar 13, but merely has its own grounded conductor connection for electronics module 2 via plug-in terminal 6, bus bar 49, and conductive member 50 that engages the support rail 1.

Figure 12:
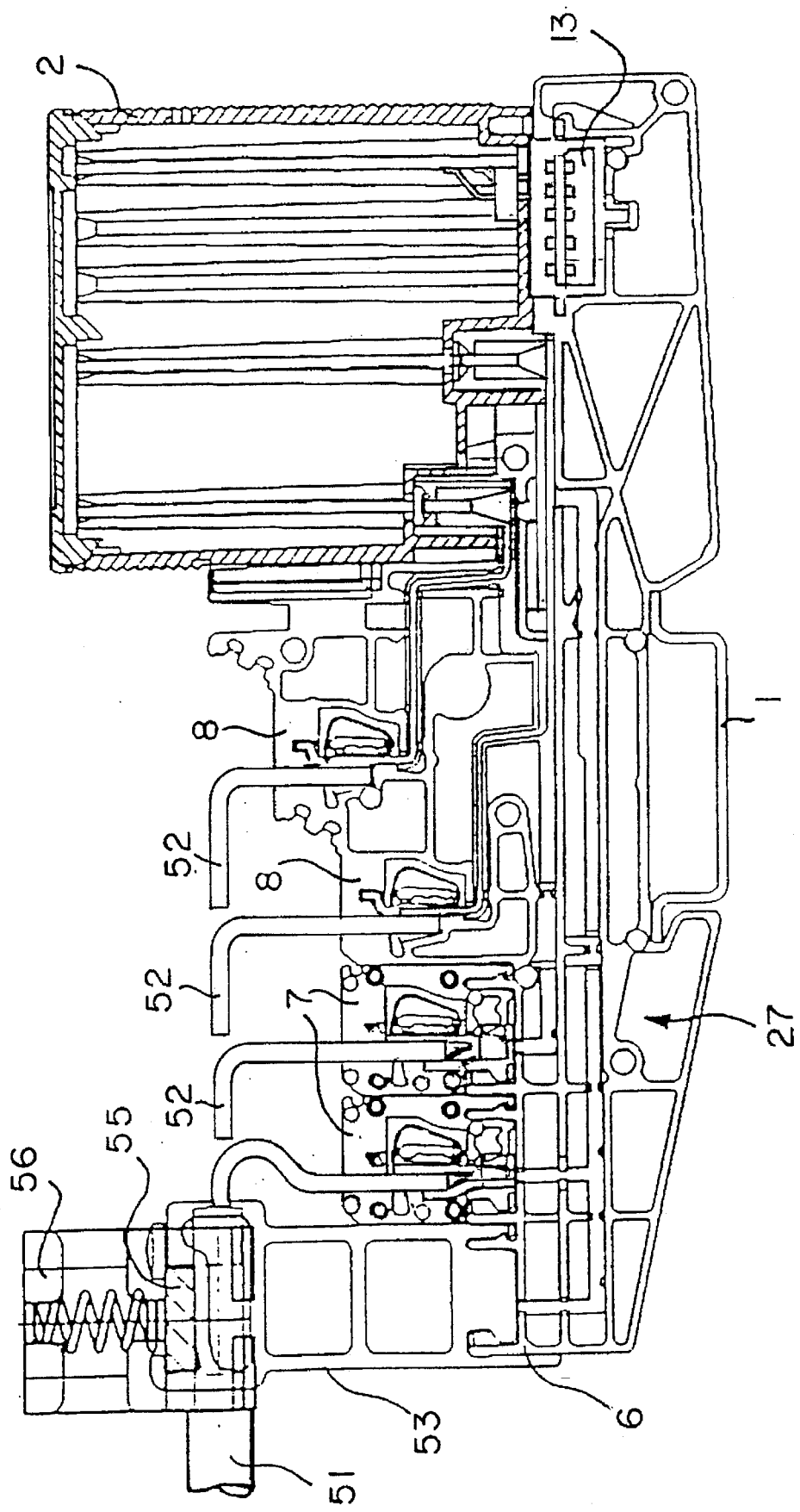
FIG. 12 is a side elevational view of a modification of the control signal terminal block of FIG. 7, including cable and bus bar power supply means.
Figure 13:
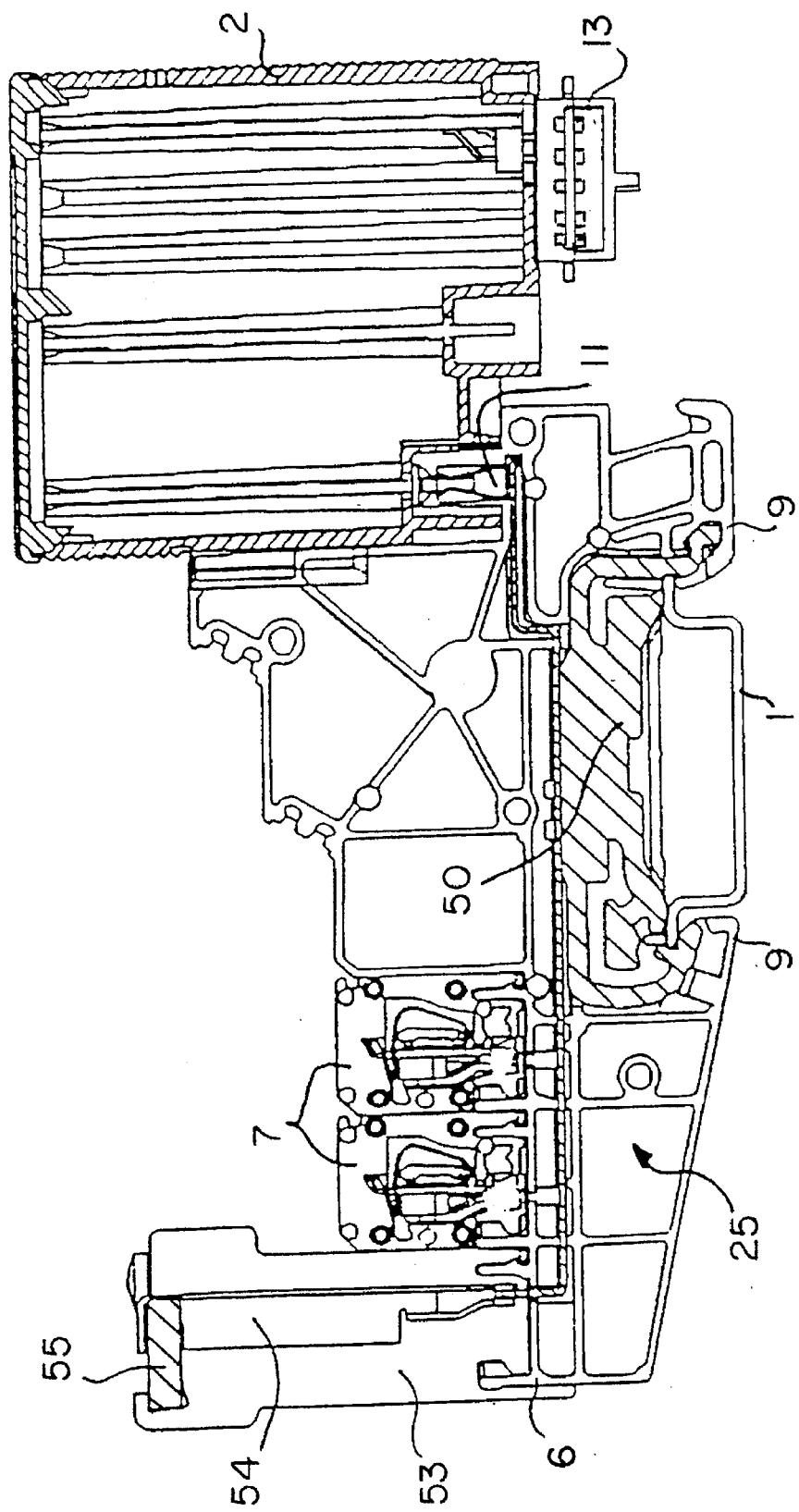
FIG. 13 is a side elevational view of a power supply terminal block with the bus bar power supply input of FIG. 12.
Figure 14:
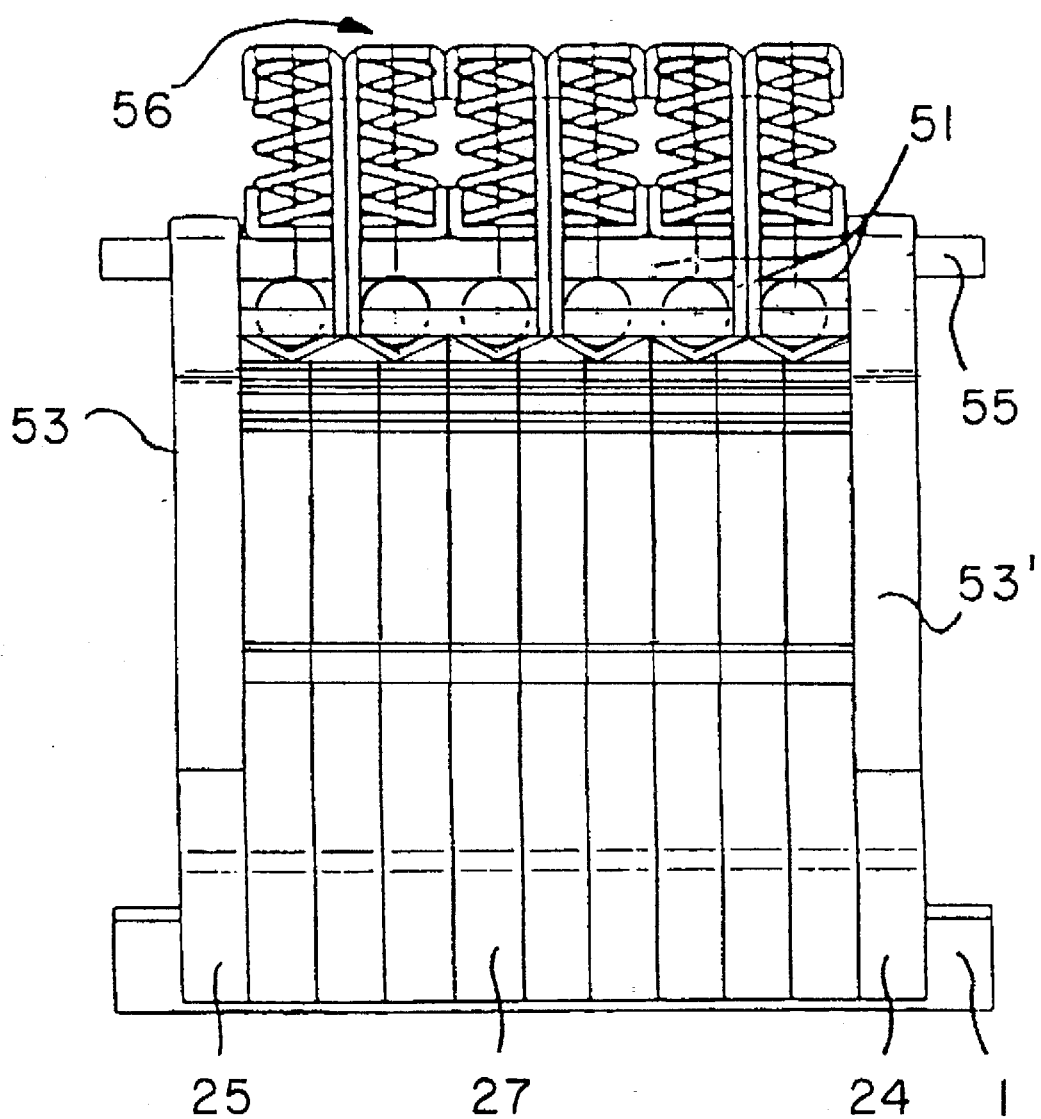
FIG. 14 is an end view of the cable and bus bar power supply of FIG. 14.

Referring now to FIGS. 12–14, the means for electrically shielding the conductors leading to or from the sensors, switches, reactors, field units and the like are shown. To this end, a strap is placed on the two terminal blocks at opposite ends of the control signal terminal blocks, which strap includes a pair of plug-in bases 53 and 53' that are connected with the ground and end terminal blocks 25 and 24, respectively, as best shown in FIG. 14. Mounted between the bases 53 and 53' is a conductive bus bar 55 which is mounted on top of the assembly in place of the conductor distributor bar 7. The bus bar 55 can be connected to the mounting rail 1 or also to the electronics module 2 via the conductive metal plate 54 shown in FIG. 13. It thus establishes a direct tap to the shield means of the incoming cables 51 above the connection area of the power supply and control signal conductors. To this end, cable sheath 51, that is insulated in and that exists individually with respect the shielding, is electrically and mechanically attached to the bus bar 55 so that cable 51 will be pressed against the bus bar via a resilient pluggable clamping socket 56 that can be applied with the bus bar 55, and which biases the bus bar into engagement with the sheathing on the cable 51. In other words, in order to connect the shielding of the multi-wire cable 51, it is only necessary to insulate the individual wires 52 with corresponding length with regard to the shielding and the cable insulation so that the shielding, for example, will come to lie underneath bus bar 55 and the individual wires can be guided to the particular connection points of the control signal blocks 27. In this way, via bus bar 25, directly at the place where cable 51 rests on the connection block, there is a connection possibility for the shielding as a result of which one can obviate any rather laborious further connections of the shielding of cable 51 into the actual assembly.

FIGS. 15a and 15b illustrate the manner in which the T-shaped projections 19 on the electronics module 2 extend within the corresponding T-shaped grooves 15 provided on the vertical guide means, thereby to guide the electronic module 2 as it is vertically mounted on the assembly.

Figure 16B:
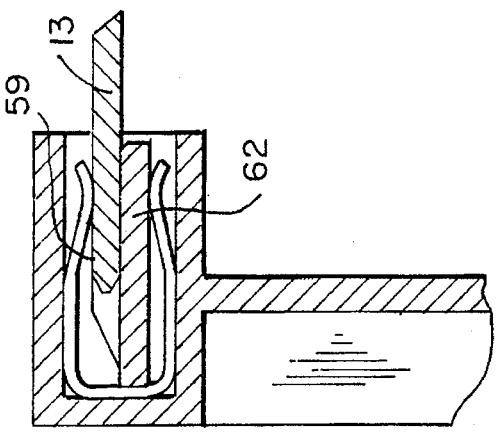
FIGS. 16b and 16c are sectional views taken along lines 16b—16b and 16c—16c of FIG. 16a, respectively.
Figure 16A:
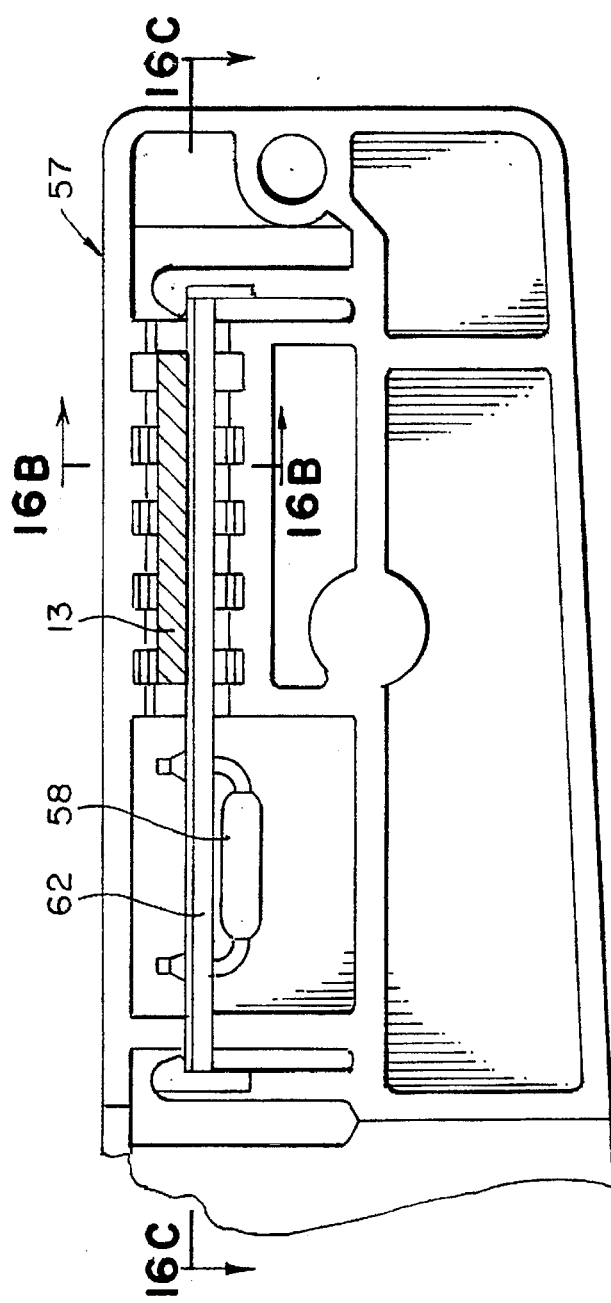
FIG. 16a is a detailed sectional view of the internal bus bar termination means.
Figure 16C:
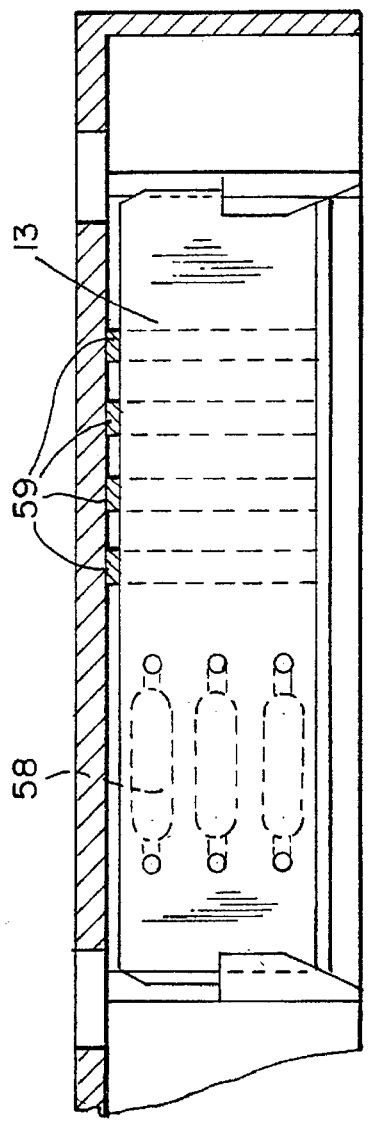

Referring now to FIGS. 16a–16c the free end of the internal bus bar means 13 is provided with a termination means 57 including a conductive plate 62 that engages the internal bus bar means 13 as best shown in FIG. 16b. The resilient contacts 59 electrically connect the internal bus bars 13 with the conductive plate 52, and also connect to the internal bus bar means 13 the terminating resistors 58 that are carried by the plate 62. Thus, the terminating means serves to prevent signal reflection at the end of the bus bar 13.

Figure 17:
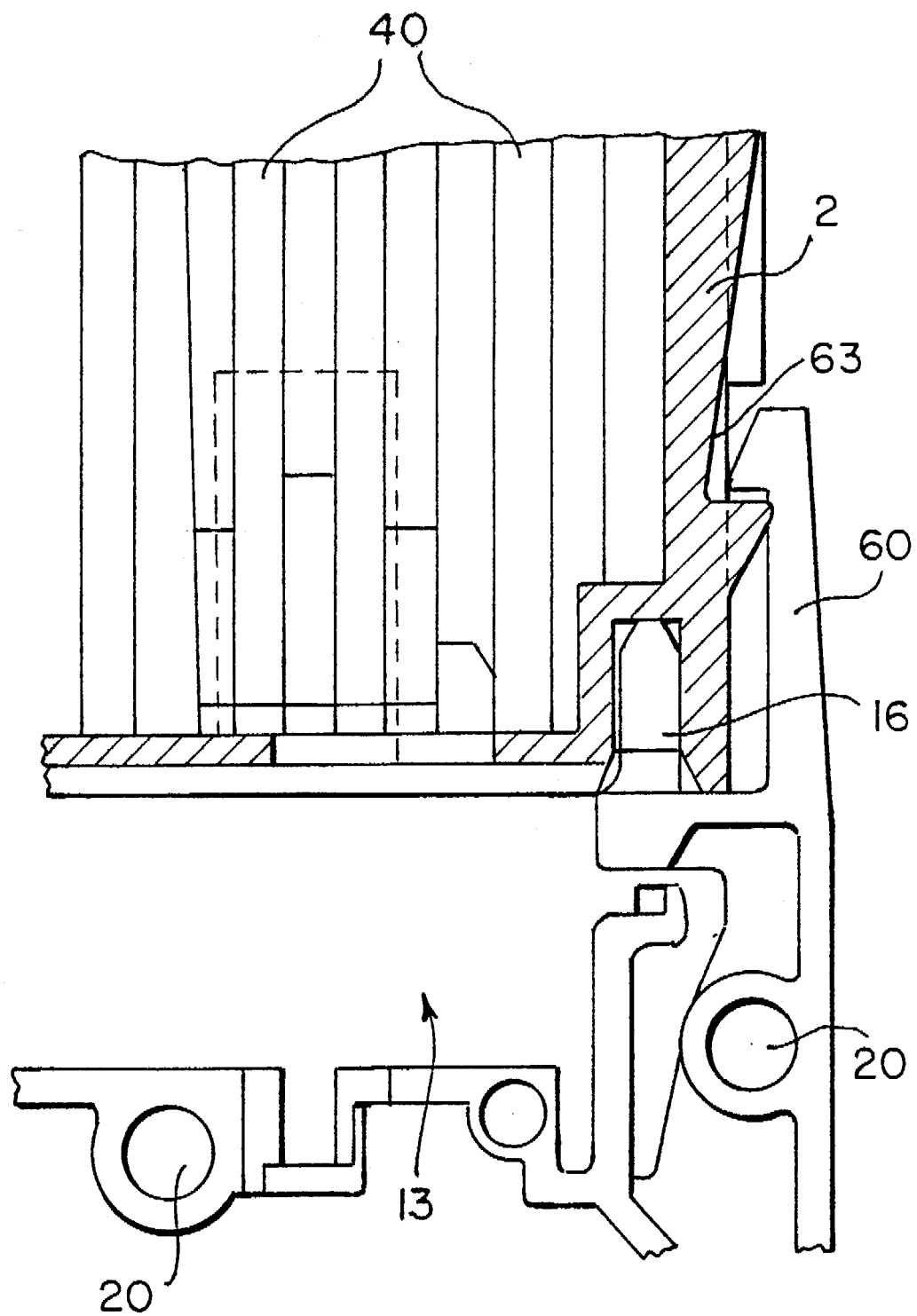
FIG. 17 is a detailed sectional view of the module fastening means of FIG. 2.

Referring to FIG. 17, another embodiment for securing the electronics module 2 to the terminal block assembly is shown. In this embodiment, catch finger 60 provided on the terminal block engaged corresponding catch recesses 63 on the wall of the housing of the electronics module, thereby to lock the module to the assembly. For each assembly, only catch hook 60 need be provided for engaging the associated catch recess 63 because this catch link serves only to secure the housing of the electronics module 2 against unintentional removal from the assembly in the non-voltage free switch state. To remove the electronics module from the assembly, one therefor needs a tool with which the catch hook 60 must be released before the module 2 can be removed.

Figure 18:
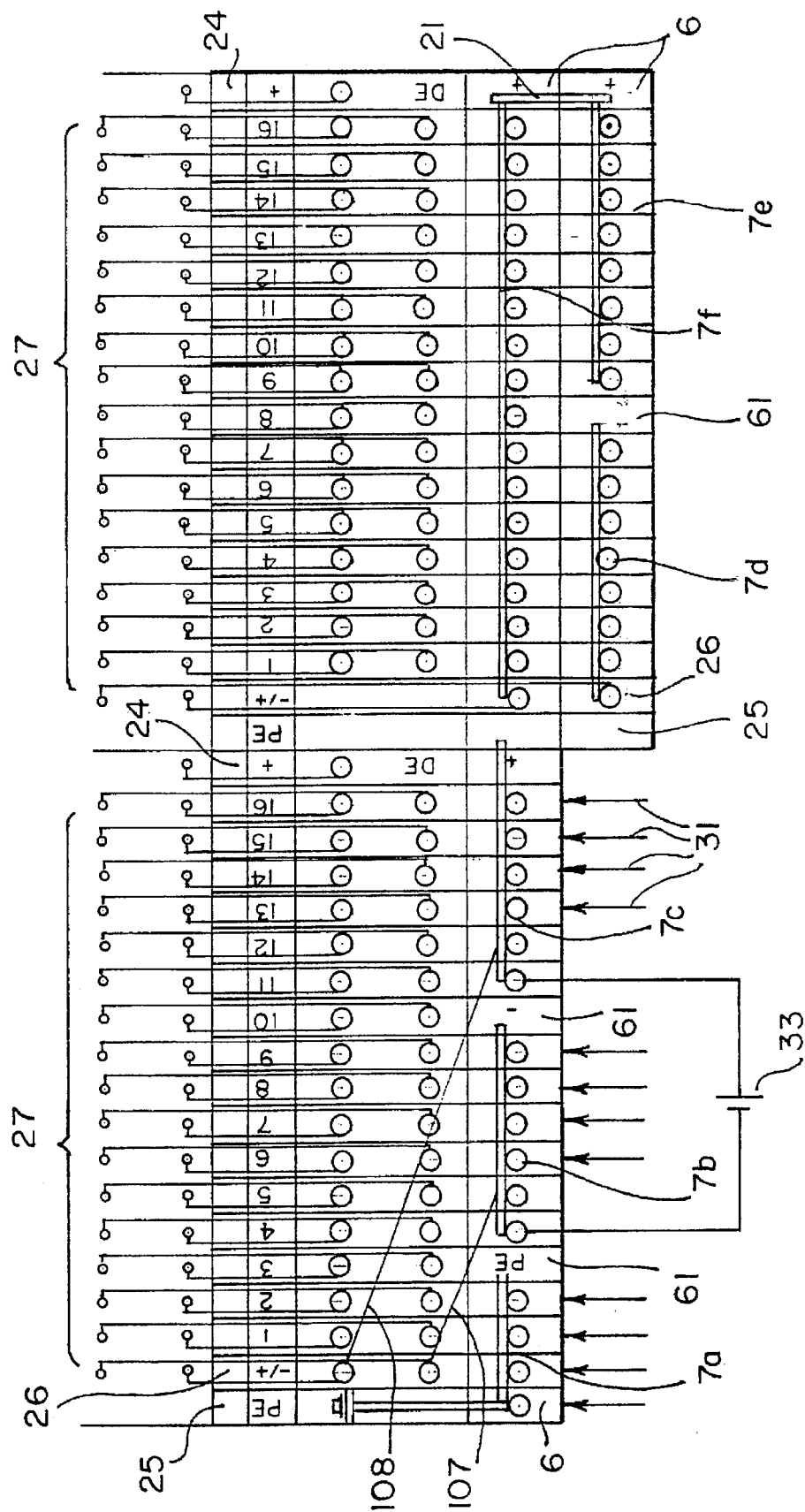
FIG. 18 is an electrical schematic representation of a terminal block assembly including potential distribution.

As shown in FIG. 18, various voltages may be obtained by providing non-conductive spacer members 61 between the various distributor bars 7a and 7b, 7b and 7c, 7d and 7e. The separate element 61 correspond with the distributor bar element 7 but are not electrically conductive. In this way, the cross connection of the aligned distributor bar element 7 is interrupted, and on the following connection 7, one can apply a different potential via an external voltage source 33 or an internal link to feed to the power supply terminal block 26. Thus, it is possible to facilitate a simple supply with differing electrical potentials if one does not work with assemblies that are not constructed for identical sensors, switches, reactors, field units or the like. It is furthermore possible to use these non-conductive separation elements 61 in order to identify the applied electrical potentials (in the form of a label bearing writing or by color coding). It is also possible that one might combine the previously mentioned possibility for inserting a bridge element 21 for the electrical tie in of two distributor bars with the above-mentioned possibility of electrical potentials that differ from terminal block to terminal block.

While in accordance with the provisions of the patent statutes the preferred forms and embodiments of the invention have been illustrated and described, it will be apparent to those skilled in the art that various changes may be made without deviating from the inventive concepts set forth above.

What is claimed is:

1. A modular control system for the electronic control of the operating systems of an automated building or the like having a grounded support rail (1), comprising:

(a) a first terminal block assembly (3) including a plurality of generally-rectangular terminal blocks (24–27) laterally stacked to define a stack axis;

(b) catch feet means (9,9') for mounting said terminal block assembly on the grounded support rail (1) with said stack axis extending parallel with the support rail;

(c) distributor bar means (7) for distributing electrical power between the terminal blocks of said assembly;

(d) internal bus bar means (13) extending parallel with said stack axis and operable to connect said first terminal block assembly with another terminal block assembly mounted on the support rail;

(e) at least one electronics module (2) removably mounted on said terminal block assembly, said module and said first terminal block assembly including at least one row of cooperating terminals (11) that extends parallel with said stack axis;

(f) bus bar connecting means (14) for connecting said internal bus bar means to an associated field bus (4);

(g) at least some of said terminal blocks of said assembly including:

(1) means (6) supporting said distributor bar means (7) on said terminal blocks;

(2) means (8) for supplying control signals to said electronics module;

(3) means (15) for removably supporting said electronics module on said terminal block assembly; and (4) means for supporting said internal bus bar means;

(h) said terminal block assembly including at least one ground terminal block (25), at least one power supply terminal block (16), and at least one control signal supply terminal block (27), said terminal blocks having terminal contacts spaced on said assembly relative to said electronics module transversely of said stack axis.

2. Apparatus as defined in claim 1, and further including an end terminal block (24), said end and ground terminal blocks being arranged on opposite sides of said assembly and each including said catch feet means (9) for connecting said terminal block assembly with the support rail.

3. Apparatus as defined in claim 1, wherein said ground terminal block (25) includes said catch feet means (9), said ground terminal block also including at least one terminal (11) connected with said electronic module means, and ground means (41, 50) for electrically connecting said one terminal with the support rail.

4. Apparatus as defined in claim 1, and further including means (7) for electrically connecting said ground terminal block with said end, power supply and control signal supply terminal blocks.

5. Apparatus as defined in claim 1, wherein said power supply terminal block (26) includes means for supporting said internal bus bar (13), means (7) for electrically connecting said power supply terminal block with said end and control signal terminal blocks, and means (45) for connecting said power supply terminal block with said electronics module.

6. Apparatus as defined in claim 1, and further including means connecting said power supply terminal block with one of the control signal terminal blocks contained in the same assembly.

7. Apparatus as defined in claim 1, wherein said supply terminal block (26') has a single conductor (47') connected between said distributor bar means and said electronics module.

8. Apparatus as defined in claim 1, wherein said control signal terminal block includes means (6) for removably supporting a distributor bar (7), at least one signal terminal (8), means 15 for removably connecting said electronics module (2) to said terminal block, and means for supporting said internal bus bar means (13).

9. Apparatus as defined in claim 8, wherein said distributor bar supporting means is color-coded.

10. Apparatus as defined in claim 7, wherein said first terminal block assembly includes at least two terminal blocks having mounting feet portions (9) for mounting said assembly on the support rail.

11. Apparatus as defined in claim 10, wherein one of said two terminal blocks is an end terminal block (24) that is solely mechanically connected with the support rail, said end terminal block being in non-conducting relation relative to the other terminal blocks in the assembly.

12. Apparatus as defined in claim 11, wherein the other of said two terminal blocks comprises a ground terminal block (25) electrically connected with the support rail, and conductor means (41,50) connecting said electronics module with the ground mounting rail.

13. Apparatus as defined in claim 11, wherein the other of said two terminal blocks comprises a control signal terminal block (26), a digital output component (37), and conductor means connecting said digital output component with said electronics module.

14. Apparatus as defined in claim 1, wherein said assembly includes a pair of ground terminal blocks arranged at opposite end of the assembly, respectively.

15. Apparatus as defined in claim 1, wherein said assembly includes a given control signal terminal block connected with a plurality of components (34) of the system.

16. Apparatus as defined in claim 1, wherein said assembly includes a plurality of control signal terminal blocks each connected with a separate component (38, 38') of the system, respectively.

17. Apparatus as defined in claim 1, and further including connector means (14) for removably mounting said internal bus bar means (13) on said assembly and for electrically connecting said internal bus bar means with the internal bus bar means of an adjacent terminal assembly.

18. Apparatus as defined in claim 1, wherein said ground terminal block (25) includes mounting feet (9) on one side thereof for connecting said terminal block on the support rail, the side of said ground terminal block remote from said one side containing means for mounting said internal bus bar means to said ground terminal block.

19. Apparatus as defined in claim 2, wherein said bus bar connecting means (14) are arranged at one end of said first terminal block assembly, said electronics module (2) being removably mounted on the side of said terminal block assembly remote from the support rail.

20. Apparatus as defined in claim 1, and further including line-terminating means (57) having a terminating resistance (58) connected with said internal bus bar means (13).

21. Apparatus as defined in claim 1, wherein said electronics module (2) includes a plurality of printed circuit boards (40) having plug-in terminals (11), respectively.

22. Apparatus as defined in claim 1, wherein a plurality of said terminal block assemblies are adapted to be mounted on the support rail, and further wherein at least one electronics module (2) is associated with each terminal block assembly, respectively.

23. Apparatus as defined in claim 8, and further including an electrical systems component (32) of the passive type connected across a pair of control signal terminals (8) of a terminal block.

24. Apparatus as defined in claim 8, and further including an electrical systems component of the active type (34) connected between a distributor bar (7) and a signal input terminal (8) of a given terminal block.

25. Apparatus as defined in claim 1, wherein said electronics module (2) includes a housing (2) that straddles said first terminal block assembly (3) and stabilizes the terminal blocks thereof.

26. Apparatus as defined in claim 25, and further wherein said terminal blocks include resilient catch means (17) adapted for cooperation with corresponding recesses (28) contained in said module housing for fastening said module to said terminal block assembly.

27. Apparatus as defined in claim 26, wherein said terminal blocks include resilient catch means (60), one of said catch means of said assembly being in engagement with a corresponding recess contained in said module housing.

28. Apparatus as defined in claim 26, wherein each of said terminal blocks includes guide means (15) for guiding said module during the connection thereof to said terminal block assembly (3), said guide means including a T-shaped tongue element (19) on one of said terminal block and said housing means for engagement with a T-shaped slot contained on the other of said means.

29. Apparatus as defined in claim 28, wherein said electronics module housing is stepped to insure mounting of said module (2) with only one given orientation relative to said terminal block assembly (3).

30. Apparatus as defined in claim 1, wherein when an electronics module (2) is removed from one of the terminal block assemblies on the support rail, the remaining assemblies on the support rail remain operable.

31. Apparatus as defined in claim 1, and further including an adjustable length bus bar (55) mounted on said ground terminal block (25) of one assembly and the end terminal block (24) of an adjacent assembly, and resilient contact means (56) for connecting the ground lead of an associated cable (51) with said adjustable length bus bar.

32. Apparatus as defined in claim 1, wherein the terminals of the terminal blocks of said assembly are arranged on the side of the terminal blocks that is remote from the support rail (1), thereby to permit removal of said electronics module without disconnecting the wiring of said modular control system.

33. Apparatus as defined in claim 1, and further including indicia-bearing members arranged above the level of the conductors.

34. Apparatus as defined in claim 1, wherein said distributor bar means (7) extends parallel with the support rail (1).

35. Apparatus as defined in claim 1, and further including bridge means (21) arranged on one end of said first terminal block assembly for electrically connecting first and second terminals on a given terminal block.

36. Apparatus as defined in claim 1, and further including non-conductive spacer elements (61) arranged between the distributor bar means (7) of one group of terminal blocks and the distributor bar means of a second group of terminal blocks.

* * * * *